US012270781B2

(12) United States Patent
Yang et al.

(10) Patent No.: US 12,270,781 B2
(45) Date of Patent: *Apr. 8, 2025

(54) ELECTROCHEMICAL DEVICE FOR IDENTIFYING ELECTROACTIVE ANALYTE AND RELATED METHODS THEREOF

(71) Applicant: University of Virginia Patent Foundation, Charlottesville, VA (US)

(72) Inventors: Cheng Yang, Lexington, MA (US); B. Jill Venton, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/847,532

(22) Filed: Jun. 23, 2022

(65) Prior Publication Data

US 2023/0094625 A1     Mar. 30, 2023

Related U.S. Application Data

(63) Continuation of application No. 16/348,916, filed as application No. PCT/US2017/061091 on Nov. 10, 2017, now Pat. No. 11,371,958.

(60) Provisional application No. 62/422,320, filed on Nov. 15, 2016.

(51) Int. Cl.
| | | |
|---|---|---|
| *G01N 27/327* | (2006.01) | |
| *H10K 85/20* | (2023.01) | |
| *B82Y 10/00* | (2011.01) | |
| *B82Y 15/00* | (2011.01) | |
| *B82Y 40/00* | (2011.01) | |

(52) U.S. Cl.
CPC ....... *G01N 27/3278* (2013.01); *H10K 85/221* (2023.02); *B82Y 10/00* (2013.01); *B82Y 15/00* (2013.01); *B82Y 40/00* (2013.01); *G01N 27/327* (2013.01)

(58) Field of Classification Search
CPC . C12Q 1/00; C12Q 1/02; C12Q 1/006; C12Q 1/34; C12Q 1/54; G01N 27/3278; G01N 27/40; G01N 27/327; A61B 5/150274; A61B 2562/12; B82Y 10/00; B82Y 15/00; B82Y 40/00
See application file for complete search history.

(56) References Cited

U.S. PATENT DOCUMENTS

| | | | |
|---|---|---|---|
| 6,576,102 B1 * | 6/2003 | Rappin | G01N 27/3272 |
| | | | 204/403.01 |
| 11,371,958 B2 * | 6/2022 | Yang | G01N 27/3278 |

(Continued)

*Primary Examiner* — Gurpreet Kaur
(74) *Attorney, Agent, or Firm* — Robert J. Decker

(57) ABSTRACT

An electrochemical device for identifying electroactive analytes. The device includes a substrate; a sample region; a counter electrode; a reference electrode; a working electrode disposed in communication with the substrate, and the working electrode may be an electron conducting fiber. Further, the counter electrode, reference electrode, and working electrode are partially disposed in the sample region configured to be exposed to the electroactive analyte. Further yet, a counter electrode channel, reference electrode channel, and working electrode channel are disposed in the substrate configured to: accommodate each of the counter electrode, reference electrode, and working electrode, respectively, for placement in the respective channels.

37 Claims, 11 Drawing Sheets

(56) References Cited

U.S. PATENT DOCUMENTS

2012/0165634 A1* 6/2012 Lee .................... A61B 5/4064
607/45
2013/0248378 A1* 9/2013 Kanemoto ......... G01N 27/3271
205/641

* cited by examiner

ELECTROCHEMICAL DEVICE FOR IDENTIFYING ELECTROACTIVE ANALYTE AND RELATED METHODS THEREOF

RELATED APPLICATIONS

The present application is a continuation application of U.S. application Ser. No. 16/348,916, filed May 10, 2019, which is a is a national stage filing of International Application No. PCT/US2017/061091, filed Nov. 10, 2017, which claims benefit of priority under 35 U.S.C § 119 (e) from U.S. Provisional Application Ser. No. 62/422,320, filed Nov. 15, 2016, entitled "High Performance, Low Cost Carbon Nanotube Yarn based 3D Printed Electrodes Compatible with Screen Printed Electrode System", the disclosures of which are hereby incorporated by reference herein in their entirety.

STATEMENT OF GOVERNMENT INTEREST

This invention was made with government support under Grant No. DA037584, awarded by the National Institutes of Health. The government has certain rights in the invention.

FIELD OF INVENTION

The present disclosure relates generally to electrochemical devices for identifying electroactive analytes and related methods of manufacture and use thereof, and more particularly to devices having high reproducibility and customizable aspects.

BACKGROUND

Carbon nanomaterials, such as graphene or carbon nanotubes (CNTs), are commonly used for electrochemical detection of biomolecules because of their promising electron transfer kinetics, high conductivity, good antifouling properties, and biocompatibility. However, most of the current applications are based on screen printed electrodes (SPE), whereby inks are needed to be made with carbon nanomaterials, and which further requires a surfactant to improve carbon nanomaterial dispersion and mineral binders or insulating polymers to improve the adhesion onto the substrate. In addition, the exact ink formulation are not readily attainable. Moreover, the SPE fabrication method is not suitable for macrostructured materials, such as fibers or the like.

Therefore, the application of carbon nanomaterials using SPE fabrication method has limited choices of materials.

There is need for a new electrochemical sensors fabrication methods with low-cost, high reproducibility but also a customizable design to provide a platform for the application of fiber-like materials. There is a need for new electrochemical sensors that have low-cost, high reproducibility but also achieves a customizable design to provide a platform for the application of fiber-like materials.

SUMMARY OF EXEMPLARY EMBODIMENTS OF THE INVENTION

An aspect of an embodiment of the present invention provides, among other things, 3D printing technology with carbon nanotube yarns for electrochemical sensing of dopamine in the presence of ascorbic acid and uric acid. An aspect of an embodiment of the present invention provides, among other things, a novel 3D printed electrode that includes a circular concavity detection zone with grooves to insert three electrodes. In an embodiment, the electrode connections are fully compatible with conventional screen printed electrode workstation setups. In an embodiment, the CNT yarn 3D printed electrode showed excellent electrocatalytic activity for the redox reaction of dopamine (DA) in the presence of ascorbic acid (AA) and uric acid (UA). Three well-defined sharp and fully resolved anodic peaks were found with the peak potentials using cyclic voltammetry (CV) at 50 mV, 305 mV, and 545 mV for AA, DA, and UA respectively and using differential pulse voltammetry (DPV) at 91 mV, 389 mV, and 569 mV, respectively. DA detection limit was $0.87\pm0.09$ μM. The CNT yarn 3D printed electrode displayed high reproducibility and stability. The electrode design enables the study of electrode reactions at the sidewall of CNTs, which cannot be performed using electrodes made by conventional fabrication methods. An aspect of an embodiment, includes a new fabrication method that provides a new platform to prototype new electrode materials for electrochemistry, thereby providing a low-cost, customizable design compatible with existing screen printed electrodes technology.

An aspect of an embodiment provides, but is not limited thereto, a method of making an electrochemical device for identifying at least one electroactive analyte. The method may include providing a substrate having a sampling end and a connection end; creating a sample region disposed at the sampling end of the substrate; and creating a counter electrode channel, reference electrode channel, and/or working electrode channel disposed in the substrate. An aspect of an embodiment may further comprise placing a counter electrode disposed in communication with the counter electrode channel for alignment therein. An aspect of an embodiment may further comprise placing a reference electrode disposed in communication with the reference electrode channel for alignment therein. An aspect of an embodiment may further comprise placing a working electrode disposed in communication with the working electrode channel for alignment therein. The working electrode may comprise an electron conducting fiber. An aspect of an embodiment may further comprise disposing a conductive lead in communication with each of respective readout ends of each of the counter electrode, reference electrode, and/or working electrode. An aspect of an embodiment may further comprise wherein the conductive lead is configured to communicate with a readout device or other ancillary coupling or transmission channel. An aspect of an embodiment may further comprise, each of respective sample ends of the counter electrode, reference electrode, and/or working electrode are disposed in the sample region configured to be exposed to the electroactive analyte. Moreover, an aspect of an embodiment may further comprise wherein the placing of the of the counter electrode channel, reference electrode channel, and/ or working electrode channel includes shaping the counter electrode, reference electrode, and/or working electrode, respectively, within the counter electrode channel, reference electrode channel, and working electrode channel, respectively. An aspect of an embodiment may further comprise wherein the placement for shaping the counter electrode, reference electrode, and/or working electrode includes aligning them for a readout device or other ancillary coupling or transmission channel. Further yet, the creating of the channels may be provided by lithographically contouring the substrate, etching the substrate, molding the substrate, or 3D printing the substrate. Still further, an aspect of an embodiment may further comprise disposing of an adhesive on the counter electrode, reference electrode, and/or working electrode to attach each of the counter electrode, reference electrode, and/or working electrode to each of the counter channel, reference channel, and working channel, respectively. Still further, an aspect of an embodiment may further comprise sealing a portion of each of the counter electrode, reference electrode, and/or working electrode. In an approach, a non-sealed portion is provided whereby the counter electrode, reference electrode, and/or working electrode is configured to be exposed to electroactive analyte in the sample region.

An aspect of an embodiment provides, but not limited thereto, an electrochemical device for identifying at least one electroactive analyte. The device may comprise a substrate having a sampling end and a connection end of the substrate and a sample region disposed at the sampling end. An aspect of an embodiment may further comprise a counter electrode disposed in communication with the substrate, a reference electrode disposed in communication with the substrate, and/or a working electrode disposed in communication with the substrate. In an embodiment, the working electrode may comprise an electron conducting fiber. An aspect of an embodiment may further comprise a conductive lead disposed in communication with each of respective readout ends of each of the counter electrode, reference electrode, and/or working electrode. An aspect of an embodiment may further comprise, wherein the conductive lead is configured to allow the counter electrode, reference electrode, and/or working electrode to communicate with a readout device or other ancillary coupling or transmission channel. An aspect of an embodiment may further comprise wherein each of respective sample ends of the counter electrode, reference electrode, and/or working electrode are partially disposed in the sample region configured to be exposed to the electroactive analyte.

An aspect of an embodiment may further comprise a counter electrode channel, reference electrode channel, and working electrode channel disposed in the substrate. An aspect of an embodiment may further comprise wherein the counter electrode channel, reference electrode channel, and/or working electrode channel are configured to: accommodate each of the counter electrode, reference electrode, and/or working electrode, respectively, for placement in the respective channels. An aspect of an embodiment may further comprise wherein the counter electrode channel, reference electrode channel, and/or working electrode channel are configured to: shape the longitudinal spans of the counter electrode, reference electrode, and/or working electrode, respectively, within the counter electrode channel, reference electrode channel, and/or working electrode channel, respectively. An aspect of an embodiment may further comprise wherein the placed and shaped counter electrode, reference electrode, and/or working electrode are resultantly aligned for a readout device or other ancillary coupling or transmission channel. An aspect of an embodiment of the electrochemical device may be provided as a kit, wherein the kit may include: a readout device; an ancillary coupling or a transmission channel; or both a readout device and an ancillary coupling or a transmission channel.

An aspect of an embodiment of the present invention provides, but not limited thereto, an electrochemical device for identifying at least one electroactive analyte. The device may comprise: a substrate; a sample region disposed at the substrate; a counter electrode disposed in communication with the substrate; a reference electrode disposed in communication with the substrate; a working electrode disposed in communication with the substrate, and the working electrode comprises an electron conducting fiber. Further, the counter electrode, reference electrode, and working electrode are partially disposed in the sample region configured to be exposed to the electroactive analyte. Further yet, a counter electrode channel, reference electrode channel, and working electrode channel are disposed in the substrate configured to: accommodate each of the counter electrode, reference electrode, and working electrode, respectively, for placement in the respective channels.

An aspect of an embodiment of the present invention provides, but not limited thereto, is an electrochemical device for identifying at least one electroactive analyte. The device may comprise: a substrate; a sample region disposed at the substrate; a counter electrode disposed in communication with the substrate; a reference electrode disposed in communication with the substrate; a working electrode disposed in communication with the substrate, and the working electrode may comprise of a variety of fibers, wires, conductors, and materials as desired or required. Further, the counter electrode, reference electrode, and working electrode are partially disposed in the sample region configured to be exposed to the electroactive analyte. Further yet, a counter electrode channel, reference electrode channel, and working electrode channel are disposed in the substrate configured to: accommodate each of the counter electrode, reference electrode, and working electrode, respectively, for placement in the respective channels.

An aspect of an embodiment of the present invention provides, but not limited thereto, a method of making an electrochemical device for identifying at least one electroactive analyte. The method may comprising: providing a substrate having a sampling end and a connection end; creating a sample region disposed at the sampling end of the substrate; creating a counter electrode channel, reference electrode channel, and working electrode channel disposed in the substrate; placing a counter electrode disposed in communication with the counter electrode channel, and wherein the placement aligns the counter electrode; placing a reference electrode disposed in communication with the reference electrode channel, and wherein the placement aligns the reference electrode; and placing a working electrode disposed in communication with the working electrode channel. Further, wherein the placement aligns the working electrode. Still yet, the working electrode comprises an electron conducting fiber. Further yet, portions of each the counter electrode, reference electrode, and working electrode are disposed in the sample region configured to be exposed to the electroactive analyte.

An aspect of an embodiment of the present invention provides, but not limited thereto, a method of making an electrochemical device for identifying at least one electroactive analyte. The method may comprising: providing a substrate having a sampling end and a connection end; creating a sample region disposed at the sampling end of the substrate; creating a counter electrode channel, reference electrode channel, and working electrode channel disposed in the substrate; placing a counter electrode disposed in communication with the counter electrode channel, and wherein the placement aligns the counter electrode; placing a reference electrode disposed in communication with the reference electrode channel, and wherein the placement aligns the reference electrode; and placing a working electrode disposed in communication with the working electrode channel. Further, wherein the placement aligns the working electrode. Still yet, the working electrode may comprise of a variety of fibers, wires, conductors, and materials as desired or required. Further yet, portions of each the counter electrode, reference electrode, and working electrode are disposed in the sample region configured to be exposed to the electroactive analyte.

It should be appreciated that any of the components or modules referred to with regards to any of the present invention embodiments discussed herein, may be integrally or separately formed with one another. Further, redundant functions or structures of the components or modules may be implemented. Moreover, the various components may be communicated locally and/or remotely with any user/clinician/patient or machine/system/computer/processor. Moreover, the various components may be in communication via wireless and/or hardwire or other desirable and available communication means, systems and hardware. Moreover, various components and modules may be substituted with other modules or components that provide similar functions.

It should be appreciated that the device and related components discussed herein may take on all shapes along the entire continual geometric spectrum of manipulation of x, y and z planes to provide and meet the anatomical, environmental, and structural demands and operational requirements. Moreover, locations and alignments of the various components may vary as desired or required.

It should be appreciated that various sizes, dimensions, contours, rigidity, shapes, flexibility and materials of any of the components or portions of components in the various embodiments discussed throughout may be varied and utilized as desired or required.

It should be appreciated that while some dimensions are provided on the aforementioned figures, the device may constitute various sizes, dimensions, contours, rigidity, shapes, flexibility and materials as it pertains to the components or portions of components of the device, and therefore may be varied and utilized as desired or required.

Although example embodiments of the present disclosure are explained in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" may be any applicable human, animal, or other organism, living or dead, or other biological or molecular structure or chemical environment, and may relate to particular components of the subject, for instance specific tissues or fluids of a subject (e.g., human tissue in a particular area of the body of a living subject), which may be in a particular location of the subject, referred to herein as an "area of interest" or a "region of interest."

Some references, which may include various patents, patent applications, and publications, are cited in a reference list and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the $n^{th}$ reference in the list. All references cited and discussed in this specification are incorporated herein by reference in their entireties and to the same extent as if each reference was individually incorporated by reference.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g. 1 to 5 includes 1, 1.5, 2, 2.75, 3, 3.90, 4, 4.24, and 5). Similarly, numerical ranges recited herein by endpoints include subranges subsumed within that range (e.g. 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

These and other objects, along with advantages and features of various aspects of embodiments of the invention disclosed herein, will be made more apparent from the description, drawings and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings.

The accompanying drawings, which are incorporated into and form a part of the instant specification, illustrate several aspects and embodiments of the present invention and, together with the description herein, serve to explain the principles of the invention. The drawings are provided only for the purpose of illustrating select embodiments of the invention and are not to be construed as limiting the invention.

DETAILED DESCRIPTION OF EXEMPLARY EMBODIMENTS

Figure 3:
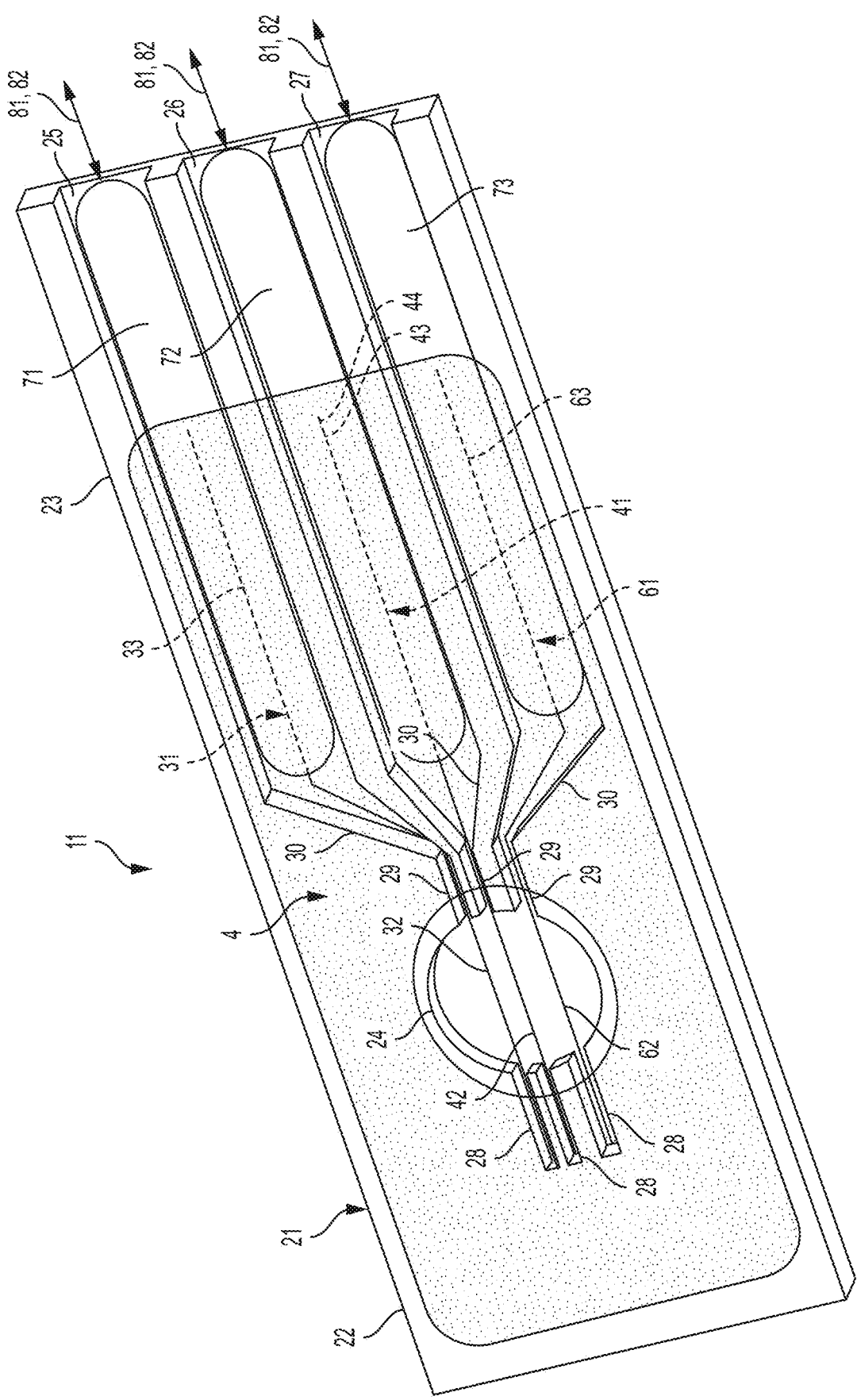
FIG. 3 provides a schematic top perspective view of an aspect of an embodiment of an electrochemical device of the presently disclosed subject matter.

FIG. 3 provides a schematic top perspective view of an aspect of an embodiment of an electrochemical device of the presently disclosed subject matter. The electrochemical device 11 may be used for identifying at least one electrochemical analyte. In an embodiment the electrochemical device 11 includes a substrate 21 having a sampling end 22 and a connection end 23 of the substrate 24. The substrate 21 also includes a sample region 24 disposed at the sampling end 22 of the substrate 21. The substrate 21 may also include a counter electrode 61 disposed in communication with the substrate 21, wherein the counter electrode 61 may have a sample end 62 and a readout end 63, wherein a counter electrode longitudinal span is generally defined by the axis of the counter electrode. The substrate 21 may also include a reference electrode 31 disposed in communication with the substrate 21, wherein the reference electrode 31 may have a sample end 32 and a readout end 33, wherein a reference electrode longitudinal span is generally defined by the axis of the reference electrode 31. The substrate 21 may also include a working electrode 41 disposed in communication with the substrate 21, wherein the working electrode 41 may have a sample end 42 and a readout end 43, wherein a working electrode longitudinal span is generally defined by the axis of the working electrode 41. In an embodiment the working electrode 41 may be an electron conducting fiber. In an embodiment, a conductive lead 71, 72, 73 may be disposed in communication with each of respective readout ends of each of the counter electrode 31, reference electrode 61, and working electrode 41, wherein the conductive leads 71, 72, 73 may be configured to allow the counter electrode 41, reference electrode 61, and working electrode 41 to communicate with a readout device 81 or other ancillary coupling or transmission channel 82; or both a readout device 81 or other ancillary coupling or transmission channel 82. In an embodiment, the conductive leads 71, 72, 73 may be comprised of, for example, a metal conductor and/or conductive glue; as well as or other suitable conductive lead hardware or materials.

Still referring to FIG. 3, in an embodiment, each of respective sample ends 62, 32, 42 of the counter electrode 61, reference electrode 31, and working electrode 41 are partially disposed in the sample region 24 configured to be exposed to the electroactive analyte being identified. In an embodiment, the substrate 21 may also include a counter electrode channel 27, reference electrode channel 25, and working electrode channel 26 disposed in the substrate 21. In an embodiment, the counter electrode channel 27, reference electrode channel 25, and working electrode channel 26 are configured to accommodate each of the counter electrode 61, reference electrode 31, and working electrode 41, respectively, for placement in the channels so as to align them in their respective channels. Additionally, the counter electrode channel 27, reference electrode channel 25, and working electrode channel 26 are configured whereby the placement in their respective channels shapes the longitudinal spans of the counter electrode channel 27, reference electrode channel 25, and working electrode channel 26 within the counter electrode channel 27, reference electrode channel 25, and working electrode channel 26, respectively. Also shown are respective portions of the counter electrode channel 27, reference electrode channel 25, and working electrode channel 26 that include a distal shaping/alignment neck 28 and proximal shaping/alignment neck 29 that straddle opposing sides of the sample region 24 of the substrate 21. For example, in an embodiment the distal shaping/alignment neck 28 and/or proximal shaping/alignment neck 29 may function, among other things, as an anchor point or region for the placement of the counter electrode 61, reference electrode 31, and working electrode 41 in their respective channels. For example, in an embodiment the distal shaping/alignment neck 28 and/or proximal shaping/alignment neck 29 may function, among other things, as an anchor point or region for the shaping of the counter electrode 61, reference electrode 31, and working electrode 41 in their respective channels. For example, in an embodiment the respective distal shaping/alignment necks 28 and/or proximal shaping/alignment necks 29 make up a portion of the respective counter electrode channel 27, reference electrode channel 25, and working electrode channel 26.

Still referring to FIG. 3, in an embodiment, for illustrative purposes, an intermediate portion 30 of a given channel may be identified that falls on the length of the respective counter electrode channel 27, reference electrode channel 25, and working electrode channel 26, and beyond the proximal shaping/alignment neck 29 on the side closer to the reading device end of the substrate.

In instances wherein a proximal shaping/alignment neck 29 is not present then the intermediate portion 30 of a given channel may be identified that falls on the length of the respective counter electrode channel 27, reference electrode channel 25, and working electrode channel 26, and beyond the sample region 24 on the side closer to the reading device of the substrate.

Still referring to FIG. 3, in an embodiment, in some instances, the electrochemical device 11 may be provided as a kit or assembly (in addition to the device 11) that includes: a readout device 81; an ancillary coupling or a transmission channel 82; or both the readout device 81 and the ancillary coupling or a transmission channel 82.

In an embodiment of the electrochemical device 11, the placed and shaped counter electrode 61, reference electrode 31, and working electrode 41, are resultantly aligned for a readout device 81; an ancillary coupling or a transmission channel 82; or both the readout device 81 and the ancillary coupling or a transmission channel 82.

In an embodiment of the electrochemical device 11, the working electrode 41 is a carbon fiber, a carbon nanotube fiber, a carbon nanotube yarn, a carbon nanotube grown metal microwire, a carbon nanospikes grown metal microwire, or a metal fiber. In an embodiment, for example, the metal fiber may include at least one or more of any combination of the following: gold, silver, copper, platinum, tungsten, titanium, iridium, or steel.

In an embodiment, the electrochemical device 11 may be utilized for at least one or more of any combination of the following: biochemical analyses, pharmaceutical analyses, industrial analyses, or environmental analyses.

In an embodiment, for practice of the biochemical analyses the electroactive analyte includes, but not limited thereto, at least one or more of any combination of the following: adenosine, histamine, $H_2O_2$, epinephrine, norepinephrine, serotonin, endorphin, dynorphin, neuropeptides, or oxytocin. In an embodiment, for practice of the biochemical analyses the electroactive analyte may include biomolecules.

In an embodiment, for practice of the pharmaceutical analyses the electroactive analyte includes, but not limited thereto, at least one or more of any combination of the following: DNA, tumor markers, food pathogens, amino acids, carbohydrates, halides, cyanide, thiocyanate, alcohols, or arsenic. In an embodiment, for practice of the pharmaceutical analyses the electroactive analyte may include biomolecules.

In an embodiment, for practice of the industrial analyses the electroactive analyte includes, but not limited thereto, at least one or more of any combination of the following: DNA, tumor markers, food pathogens, amino acids, carbohydrates, halides, cyanide, thiocyanate, alcohols, or arsenic.

In an embodiment, for practice of the environmental analyses the electroactive analyte includes, but not limited thereto, at least one or more of any combination of the following: carbohydrates, halides, cyanide, thiocyanate, alcohols, arsenic, or metals.

In an embodiment, the electrochemical device 11 may be practiced wherein the at least one electroactive analyte includes one or more neurochemicals. In an embodiment, the electrochemical device 11 may be practiced wherein the one or more neurochemicals includes neurotransmitters. In an embodiment, the electrochemical device 11 may be practiced wherein the neurotransmitter includes at least one or more of any combination of the following: dopamine (DA), adenosine, histamine, epinephrine, norepinephrine, serotonin, endorphin, neuropeptides or oxytocin. In an embodiment, the electrochemical device 11 may be practiced wherein the at least one electroactive analyte includes at least one or more of any combination of the following: dopamine (DA) in the presence of ascorbic acid (AA), or dopamine (DA) in the presences of uric acid (UA).

In an embodiment, the substrate 21 of electrochemical device 11 may be produced by 3D printing, laser etching, etching, milling, molding, embossing, or lithography.

In an embodiment, the channels 25, 26, 27 of the electrochemical device 11 may be produced or created in the substrate 21 by 3D printing, laser etching, etching, milling, molding, embossing, or lithography.

Figure 1:
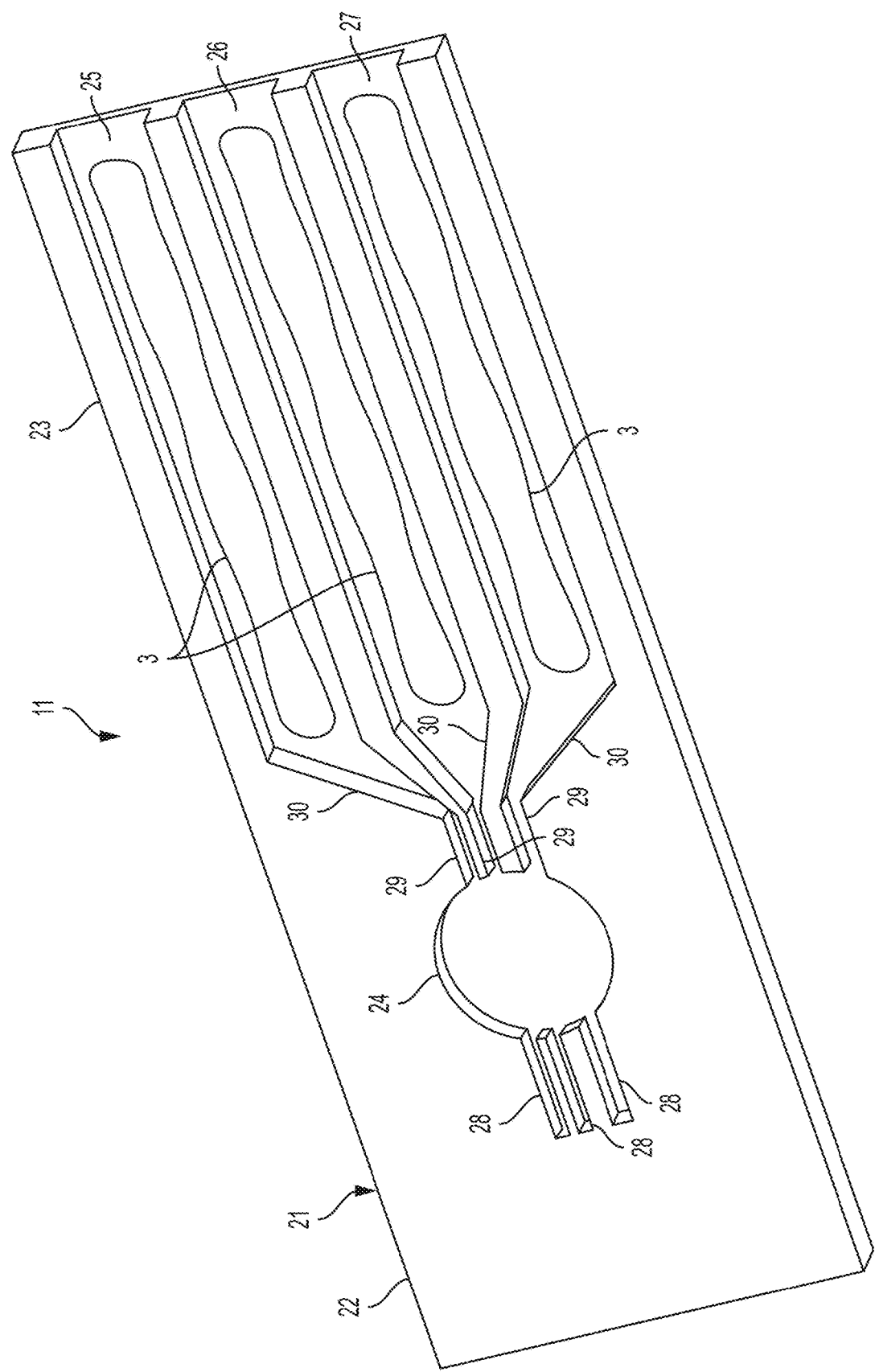
FIG. 1 provides a schematic top perspective view of an aspect of an embodiment of an electrochemical device of the presently disclosed subject matter.
Figure 2:
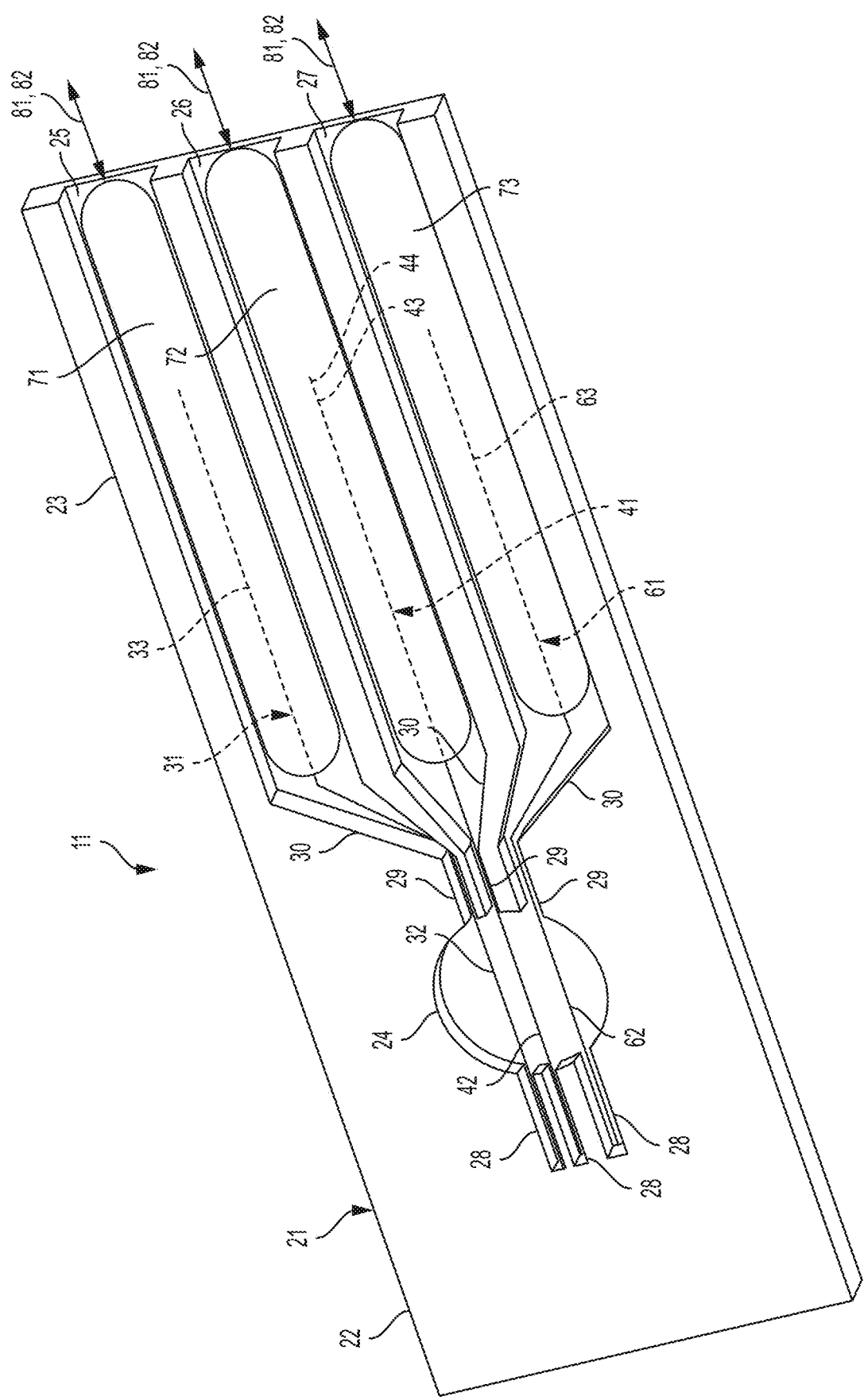
FIG. 2 provides a schematic top perspective view of an aspect of an embodiment of an electrochemical device of the presently disclosed subject matter.

In an embodiment, the electrochemical device 11 may be produced by an adhesive 3 (See FIG. 1 for purpose of schematically illustrating an adhesive, for example) disposed on the counter electrode 61, reference electrode 31, and working electrode 41, to attach each of the counter electrode 61, reference electrode 31, and working electrode 41, to each of the counter electrode channel 27, reference electrode channel 25, and working electrode channel 26, respectively. For purpose of clarity of the illustration, FIG. 1 provides the adhesive 3, without illustrating the electrodes. It should be understood pertaining to an embodiment the electrochemical device 11, the adhesive 3 would be disposed over the electrodes (not shown in FIG. 1).

In an embodiment, the electrochemical device 11 may be produced by a seal 4 provided on a portion of each the counter electrode 61, reference electrode 31, and working electrode 41. As such, in an embodiment a non-sealed portion is provided whereby the counter electrode 61, reference electrode 31, and working electrode 41 is configured to be exposed to (or arranged or located to be exposed) to the electroactive analyte in the sample region 24 of the substrate 21.

In an embodiment, the electrochemical device 11 may include the working electrode 41 that is a bare wire electrode, graphene, or carbon nanotubes (CNT). In an embodiment, the CNT working electrode 41 may be fabricated by one or more of the following processes: drawing CNTs from CNT array or CNT dry spinning.

In an embodiment, the electrochemical device 11 may include the reference electrode 31 that is comprised of at least one or more of any combination of the following: Silver/Silver Chloride (Ag/AgCl), hydrogen (H), or Copper (I)-Copper(II) (Cu(I)-Cu(II). In an embodiment, the Ag/AgCl reference electrode is fabricated by a process of chlorination of silver wires.

In an embodiment, the electrochemical device 11 may include the counter electrode 61 that is a bare wire. In an embodiment, the bare wire counter electrode may include at least one or more of any combination of the following: silver (Ag), copper (Cu), or platinum (Pt).

In an embodiment, the electrochemical device 11 may include the working electrode 41 whereby the outer surface of the working electrode 41 defines a sidewall 45; and furthest distal end of the working electrode 41 at the sample end 42 defines a tip 44.

Still referring to FIG. 3, the Applicants note that FIGS. 1-2, 4, and 13 are considered to include aspects of embodiments of the electrochemical device 11 disclosed herein as similarly discussed in the spirit and scope of FIG. 3. The electrochemical device 11 disclosed that FIGS. 1-2, 4, and 13 may, of course, be employed within the context of the embodiments disclosed herein throughout, as well as disclosed for FIG. 3.

FIGS. 14-22 provides a schematic top view of an aspect of various embodiments of an electrochemical device 11 of the presently disclosed subject matter that illustrates the counter electrode 61, reference electrode 31, and working electrode 41. Although not illustrated, the contours and patterns of the various channels of the substrate (or portions or segments of the channels of the substrate) that are produced in the substrate may be provided in a fashion so as to accommodate the placement and shaping of the respective electrodes as shown in FIGS. 14-22. The contours and patterns of the placed and shaped electrode are delivered and dictated by the characteristics of respective channels, of which are presented herein for illustration purpose only and should not be construed as limiting the invention in any way. Other contours and patterns of the respective channels (or portions of the channels) may be employed within the context of the invention other than the contours, patterns and characteristics of the respective channels (or portions of the channels) illustrated.

An aspect includes methods and approaches for making and using the various embodiments of the electrochemical device 11 for identifying at least one electrochemical analyte. For example, as disclosed in FIG. 3, provided is a schematic top perspective view of an aspect of an embodiment of an electrochemical device of the presently disclosed subject matter. Aspects of various embodiments, for example but not limited thereto, are also illustrated in FIGS. 1-2, 4, and 13, FIGS. 14-22. An aspect of an embodiment provides, but not limited thereto, a method of making an electrochemical device for identifying at least one electroactive analyte. The method may comprise providing a substrate having a sampling end and a connection end; creating a sample region disposed at the sampling end of the is substrate; and creating a counter electrode channel, reference electrode channel, and working electrode channel disposed in the substrate. An aspect of an embodiment may further comprise placing a counter electrode disposed in communication with the counter electrode channel, wherein the counter electrode includes a sample end and a readout end, wherein a counter electrode longitudinal span is defined, and wherein the placement aligns the longitudinal span of the counter electrode. An aspect of an embodiment may further comprise placing a reference electrode disposed in communication with the reference electrode channel, wherein the reference electrode includes a sample end and a readout end, wherein a reference electrode longitudinal span is defined, and wherein the placement aligns the longitudinal span of the reference electrode. An aspect of an embodiment may further comprise placing a working electrode disposed in communication with the working electrode channel, wherein: 1) the working electrode includes a sample end and a readout end, wherein a working electrode longitudinal span is defined, and wherein the placement aligns the longitudinal span of the working electrode, and 2) the working electrode comprises an electron conducting fiber. An aspect of an embodiment may further comprise disposing a conductive lead in communication with each of respective readout ends of each of the counter electrode, reference electrode, and working electrode, wherein the conductive lead is configured to communicate with a readout device or other ancillary coupling or transmission channel. An aspect of an embodiment may further comprise, each of respective sample ends of the counter electrode, reference electrode, and working electrode are disposed in the sample region configured to be exposed to the electroactive analyte. Moreover, the placing of at least one or more of any combination of the counter electrode channel, reference electrode channel, and working electrode channel includes shaping the longitudinal spans of the counter electrode, reference electrode, and working electrode, respectively, within the counter electrode channel, reference electrode channel, and working electrode channel, respectively. Moreover, the placing of the working electrode channel includes shaping the longitudinal spans of the working electrode within the working electrode channel. Further yet, the placement for shaping the counter electrode, reference electrode, and working electrode includes aligning them for a readout device or other ancillary coupling or transmission channel. Further yet, the creating of the channels may be provided by lithographically contouring the substrate, etching the substrate, molding the substrate, or 3D printing the substrate. Sill further, an aspect of an embodiment may further comprise disposing of an adhesive on the counter electrode, reference electrode, and working electrode to attach each of the counter electrode, reference electrode, and working electrode to each of the counter channel, reference channel, and working channel, respectively. Still further, an aspect of an embodiment may further comprise sealing a portion of each the counter electrode, reference electrode, and working electrode wherein a non-sealed portion is provided whereby the counter electrode, reference electrode, and working electrode is configured to be exposed to electroactive analyte in the sample region.

In an embodiment, theoretically, there's no specific requirement/limitation on the distance between each electrodes (i.e., working, reference, and counter electrodes). But practically, in an embodiment the working electrode and reference electrode are closer to each other compared to the distance between working and counter electrodes, so as to reduce the potential drop, for example. The electrodes may be aligned, placed, and shaped to meet a variety of requirements, limitations, and parameters as desired or required.

EXAMPLES

Practice of an aspect of an embodiment (or embodiments) of the invention will be still more fully understood from the following examples and experimental results, which are presented herein for illustration only and should not be construed as limiting the invention in any way.

Introduction

The present inventors submit that their ability to easily make new designs will enable 3D printing, for example, to be used for electrodes and cells for various materials.

Carbon nanomaterials, such as graphene or carbon nanotubes (CNTs), are commonly used for electrochemical detection of biomolecules because of their promising electron transfer kinetics, high conductivity, good antifouling properties, and biocompatibility. Screen printed electrode (SPE) fabrication method is one of the easiest approaches to apply carbon nanomaterials for electrochemical applications. However, an ink needs to be made with CNT, which further requires a surfactant to improve carbon nanomaterial dispersion and mineral binders or insulating polymers to improve the adhesion onto the substrate. The exact ink formulation and composition are usually are not readily attainable or usable. Moreover, the current SPE fabrication method is not suitable for macrostructured materials, such as fibers. Therefore, the current application of carbon nanomaterials using SPE fabrication method has limited choices of materials. The spacing of the connector for an SPE electrode is standard for each company and can be measured. An aspect of an embodiment of the present invention can measure the spacing and then reproduce it in a 3D printed mold. An aspect of an embodiment provides, among other things, a 3D printed electrode with a connector compatible with SPE workstations (as well as other types of workstations, systems, devices, or connectors), that can incorporate fiber and metal wire microelectrodes.

CNT yarns are a macrostructure of CNTs fabricated by solid state processes, and no dispersion in surfactant is required. Compared to graphene and CNTs paste, CNT yarns have higher purity. Moreover, in comparison to randomly distributed and tangled CNTs produced by dip coating or screen printing, well-aligned CNT yarns have the advantages of high electroactivity, chemical stability, high conductivity, controllable size, and promising antifouling properties. The CNT yarn has intrinsically abundant adsorption sites for neurotransmitters, such as dopamine, and has already been used for sensitive electrochemical sensing.

Moreover, most sensor designs are based on maximizing exposure of edge plane defects which are on the end of CNT yarn. Some have argued that CNT sidewalls are also electrocatalytic for dopamine, but a practical sensor that employs just the CNT yarn sidewall has not been developed. Thus, there is a dichotomy between the practical and the fundamental science, and an aspect an embodiment of the 3D printed electrode CNT yarn electrode disclosed herein provides a new method to fabricate a CNT sensor with only the yarn sidewalls exposed. An aspect of an embodiment disclosed herein will help elucidate the extent to which CNT sidewalls provide a good substrate for electrocatalytic detection of dopamine. An aspect of an embodiment disclosed herein of the electrode fabrication method using 3D printing provides a low-cost device designed to work with microvolumes of sample, and a novel approach for the application and fundamental electrochemistry study of various fiber materials.

Methods

Reagents and Materials

Dopamine hydrochloride, uric acid, and ascorbic acid were purchased from Sigma-Aldrich (St. Louis, MO). Dopamine stock solutions with concentration of 10 mM, uric acid and ascorbic acid stock solutions with concentration of 100 mM were prepared in $HClO_4$, and were diluted daily to the desired concentration in phosphate buffered saline (131.3 mM NaCl, 3.00 mM KCl, 10 mM $NaH_2PO_4$, 1.2 mM $MgCl_2$, 2.0 mM $Na_2SO_4$, and 1.2 mM $CaCl_2$) with the pH adjusted to 7.4).

Electrode Fabrication

Molds were designed in Autodesk Inventor Professional 2014 Student Edition, converted to an .STL file, and subsequently printed by the present inventors. The 3D printed polymer molds were manufactured on a Stratasys Connex 500 Model 1 Poly-Jet 3D printer (Stratasys Ltd, MN), which has 8 print heads with 96 nozzles per head. Water jets were used to remove the support. Rigid opaque black material (VeroBlackPlus RGD875, mainly acrylonitrile butadiene styrene, Stratasys) was used because of its suitability for rapid tooling with dimensional stability and fine detail. The heads heat up to 60° C., and the Z axis resolution with this material was 30 µm. A piece of commercially available carbon nanotube yarn (CNT yarn, 10-25 µm in diameter, 1-2 cm long, General Nano, LLC, Cincinnati, OH) was used as working electrode. The homemade reference electrode was a silver/silver chloride electrode with diameter of 250 µm, fabricated by applying 2 V potential to a 4 cm long silver wire for 30 seconds in concentrated hydrochloric acid. The counter electrode is a ~2 cm long silver wire (ESPI Metals, Ashland, OR) with a diameter of 250 µm. Electrodes materials were sealed with 5 min epoxy Loctite (Henkel Corporation. Westlake OH) which was allowed to fully cure for 24 h. The connection between electrode material and SPE adapter is achieved by stainless steel plates, and silver/silver chloride paste (The Gwent Group, United Kingdom) is used to ensure the conductivity between the plates and electrode materials.

Apparatus

All electrochemical measurements were performed on a Gamry electrochemical workstation (Gamry Reference 600, Gamry Instruments, USA). Cyclic voltammetry was applied with a triangle waveform of −0.2-0.6 V, with a scan rate of 200 mV/s. Differential pulse voltammetry was applied from 0 to 0.6 V, with amplitude of 0.05 V, pulse width of 0.05 s, sample width of 0.02 s and pulse period of 0.5 s. A commercial universal screen printed electrode cable connector (Metrohm USA Inc, FL) is used to connect the electrochemical workstation and the 3D printed electrodes. Scanning electron microscope (SEM) images were taken on Merlin field emission SEM (Zeiss. Thornwood, NY) with a secondary electron detector using an accelerating voltage of 2 kV and a working distance of 5.0 mm.

Results and Discussion

CNT Yarn Based 3D Printed Electrode Fabrication

In an embodiment, for example, the design provided a 3D printed electrode, with the dimensions of 30 mm×10 mm×2 mm. Briefly, the design is three grooves to place the is working, reference and counter electrodes in the 3D printed electrode substrate. The detection zone is a circular concavity that can hold a drop of solution (~50 L) across the three electrodes. Three metal plates are used to connect the electrodes to a potentiostat via a SPE adapter cable.

Figure 4B:
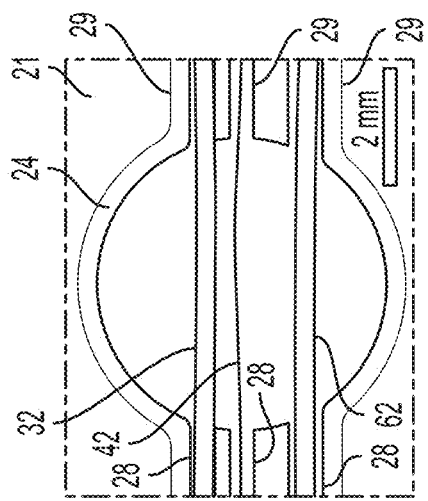
FIG. 4B provides an enlarged partial view of an aspect of the embodiment disclosed in FIG. 4A.
Figure 4C:
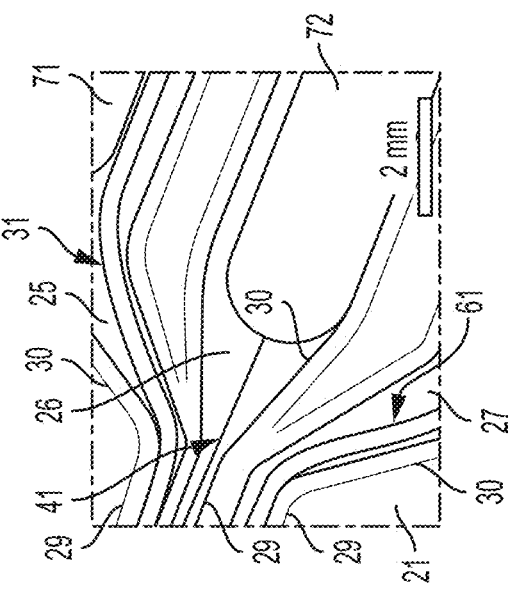
FIG. 4C provides an enlarged partial view of an aspect of the embodiment disclosed in FIG. 4A.
Figure 4A:
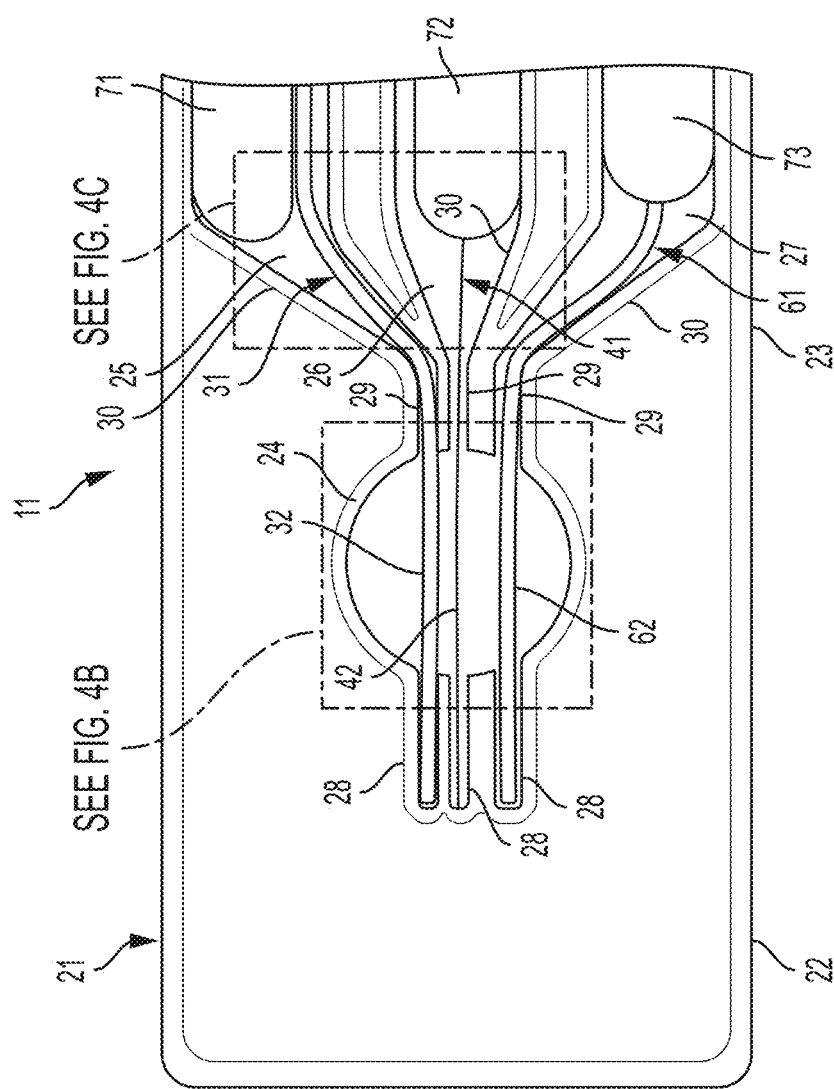
FIG. 4A provides a schematic top view of a microscopic depiction of an aspect of an embodiment of an electrochemical device of the presently disclosed subject matter.

As shown in the schematic top view of a micrographic depiction of FIGS. 4A-4C, the three grooves are for silver counter electrode (500 μm in diameter), CNT yarn working electrode (250 μm in diameter), and Ag/AgCl reference electrodes (250 μm in diameter) by viewing the illustration from bottom to top, respectively. Epoxy resin is applied as sealing agent to fix electrode materials in the grooves and limit the area of detection zone after placing all the three electrodes in grooves. Moreover, the intrinsically hydrophobic property of epoxy sealing would also help restrict the sample solution in the 4 mm diameter (0.6 mm deep) circular concavity detection area. The distance between working and reference electrodes (300 μm) is half of the distance between working and counter electrodes (600 μm), to reduce the ohmic drop. The connections between three electrodes to SPE adapters are achieved by stainless steel plates with width of 2 mm placed in the grooves with the spacing between each plates of 0.8 mm (See FIG. 4A). While this electrode was designed to fit a Metrohm universal screen printed electrode cable, 3D printed molds could be easily revised to fit the adapters for different brands of widely used and commercially available SPEs from Pine Instrumentation Inc., DropSens, or CH Instruments.

The 3D-printed electrode substrate is primarily made of acrylonitrile butadiene styrene (ABS), which is not soluble in aqueous solutions. With the help of water jets, 30 μm resolution is achieved by using ABS, which is suitable for our design with channels of hundreds of microns wide. The average cost of materials including ABS, epoxy, and electrode materials is less than 1 dollar per electrode. More importantly, the 3D printed electrode design allows any materials that are fiber-like to be made into an electrode e.g. carbon fiber, CNT yarn/fiber, metal or polymer fibers. These materials would not be easy to use with traditional SPE, so this mold is helping to broaden the materials that can be tested.

Electrochemical Characterization

Figure 6:
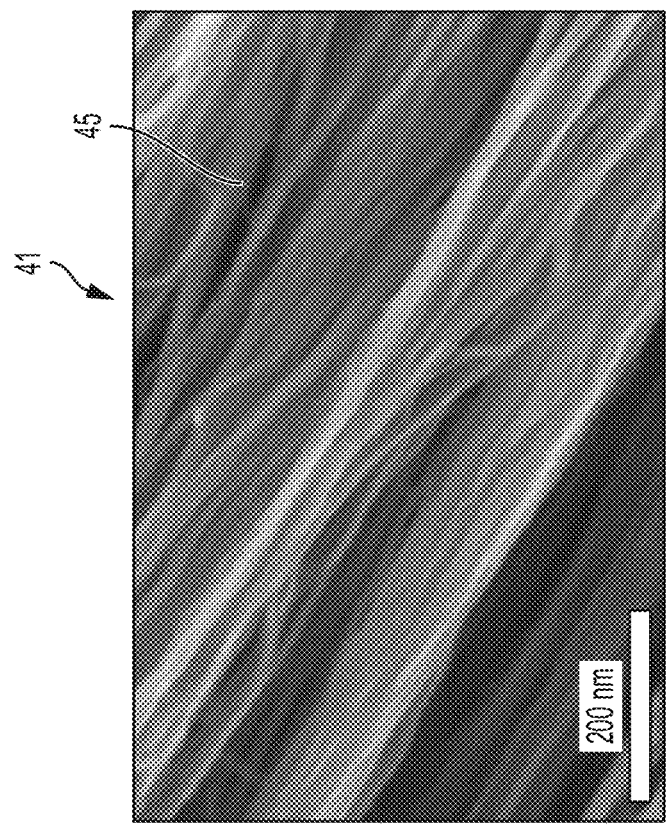
FIG. 6 provides an enlarged partial view of the microscopic image depiction of the embodiment disclosed in FIG. 5.
Figure 5:
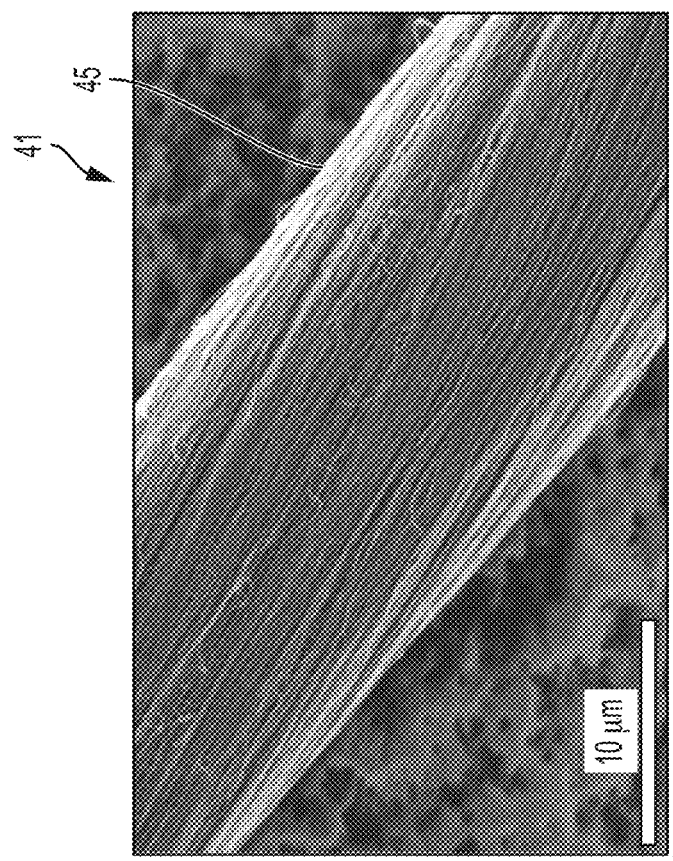
FIG. 5 provides a microscopic image depiction of an embodiment of a working electrode.
Figure 7:
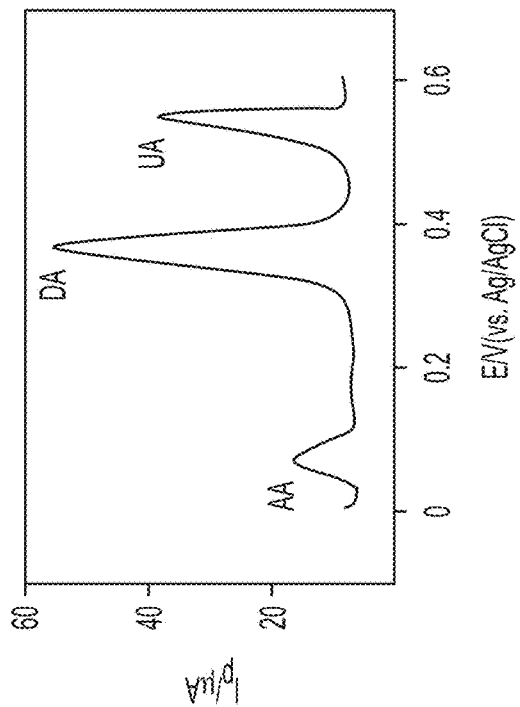
FIG. 7 relates to an aspect of an embodiment of the electrochemical characterization of CNT yarn 3D printed electrodes, wherein a graphical illustration is provided of acyclic voltammogram of 300 μM dopamine PBS (pH 7.4) solution (curve a) and a mixture of 300 μM dopamine, 1 mM uric acid and 1 mM ascorbic acid solution (curve b). Scan rate 200 mV/s.

In this work, a CNT yarn is used as working electrode material. CNT yarn is a macrostructure of CNTs with well-aligned multiwall CNTs (MWCNTs) bundles spun through the yarn, as shown in FIG. 5. The continuous MWCNTs with diameter about 30-50 nm (See FIG. 6) have abundant $sp^2$ hybridized carbons compared to $sp^3$ hybridized carbons which are mainly located at the ends of CNT bundles. The 3D printed electrode using CNT yarn as working electrode was electrochemically characterized using cyclic voltammetry scanning from −0.2 to 0.6V and back at 200 mV/s. The response to 300 μM dopamine (DA, dashed line curve) is shown in FIG. 7. For DA, the cathodic and anodic peaks appear at about 280 mV and 330 mV, respectively, a substantial positive shift of the oxidation peak potential compared to other carbon nanomaterials. The separation between the oxidation and reduction peak potential ($\Delta E_p$) is 53 f 2 mV (n=4 electrode), which is smaller than several previous works using CNT-based SPEs, indicating faster electron transfer kinetics.

Figure 8:
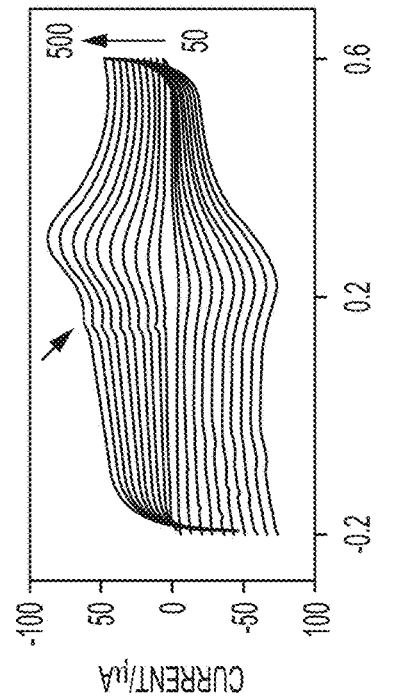
FIG. 8 relates to an aspect of an embodiment of the electrochemical characterization of CNT yarn 3D printed electrodes, wherein a graphical illustration is provided of a DPV of 300 μM dopamine in the presence of 1 mM uric acid and 1 mM ascorbic acid.

Ascorbic acid (AA) and uric acid (UA) are common interferences in tissue, and the DA selectivity over AA and UA were tested at CNT yarn 3D printed electrodes. FIG. 7 shows the CV of a mixture of 300 μM DA, 1 mM AA, and 1 mM UA (solid line curve) at the CNT yarn 3D printed electrode. The CV has three well-defined sharp, and fully resolved anodic peaks at 50 mV, 305 mV and 545 mV, corresponding to the oxidation of AA, DA, and UA, respectively. The calculated oxidation peak potential separations are 255 mV for AA-DA, 240 mV for DA-UA, and 495 mV for UA-AA, demonstrating promising selectivity for simultaneous determination of these three species. FIG. 8 displays differential pulse voltammogram (DPV) obtained at the CNT yarn 3D printed electrode for a mixture containing 300 μM DA, 1 mM AA, and 1 mM UA. The potentials for AA. DA, and UA are at 91 mV, 389 mV, and 569 mV, respectively, and the separations for AA-DA, DA-UA, and AA-UA are 298 mV, 180 mV, and 478 mV, respectively. Thus, the CNT yarn 3D printed electrode can distinguish DA, UA, and AA using both CV and DPV.

Figure 9:
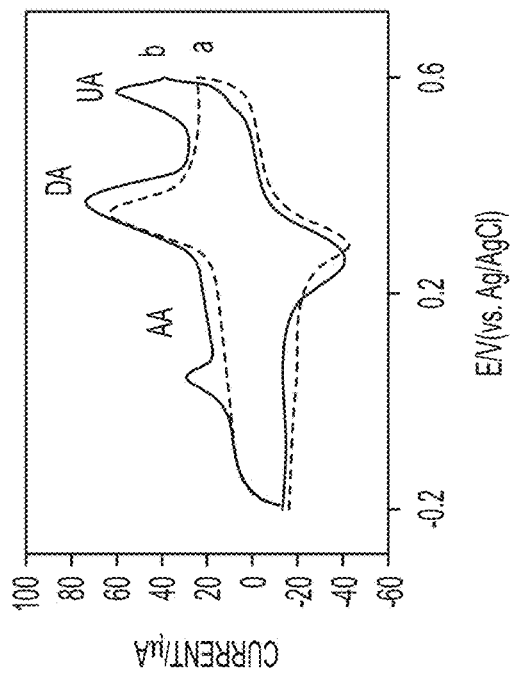
FIG. 9 relates to an aspect of an embodiment of the electrochemical characterization of CNT yarn 3D printed electrodes, wherein a graphical illustration is provided of an anodic current to different concentrations of dopamine in a range of 50 to 500 μM (n=4), with scan rate of 200 mV/s from −0.2 to 0.6 V. A linear range from 50 to 400 μM has $R^2$ of 0.9817.
Figure 11:
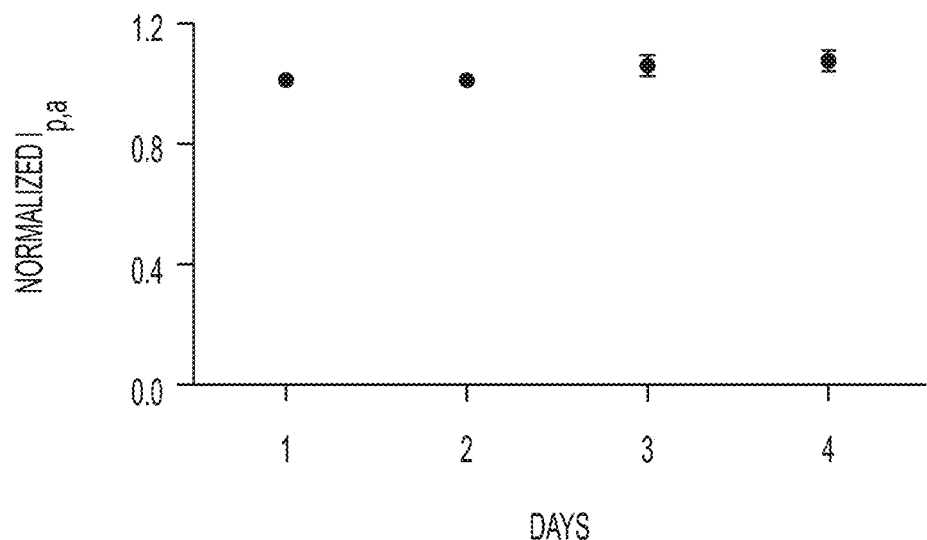
FIG. 11 relates to an aspect of an embodiment of the electrochemical characterization of CNT yarn 3D printed electrodes, wherein a graphical illustration is provided of a Cyclic voltammogram of 50 μM dopamine at different scan rates from 50 to 500 mV/s.

CNT yarn 3D printed electrodes were used to detect different concentrations from 50 μM to 500 μM DA using CV and the plot of oxidation current versus concentration is shown in FIG. 9 (n=4). A linear response was obtained from 50 μM to 400 μM ($R^2$=0.9817), and the limit of detection (LOD) is 0.87 f 0.09 μM (S/N=3). To assess the stability of the electrodes, the dopamine CV peak current was measured once per day for 4 days (see FIG. 11). The calculated RSD is only 0.986%, indicating promising shelf stability as well as its low susceptibility to electrode fouling caused by oxidized products that could strongly absorb onto the electrode surface. The electrode-to-electrode reproducibility was also checked by comparing four CNT yarn 3D printed electrodes prepared under the same conditions. The RSD for dopamine was 4.12%, confirming that the fabrication method is highly reproducible.

Figure 12:
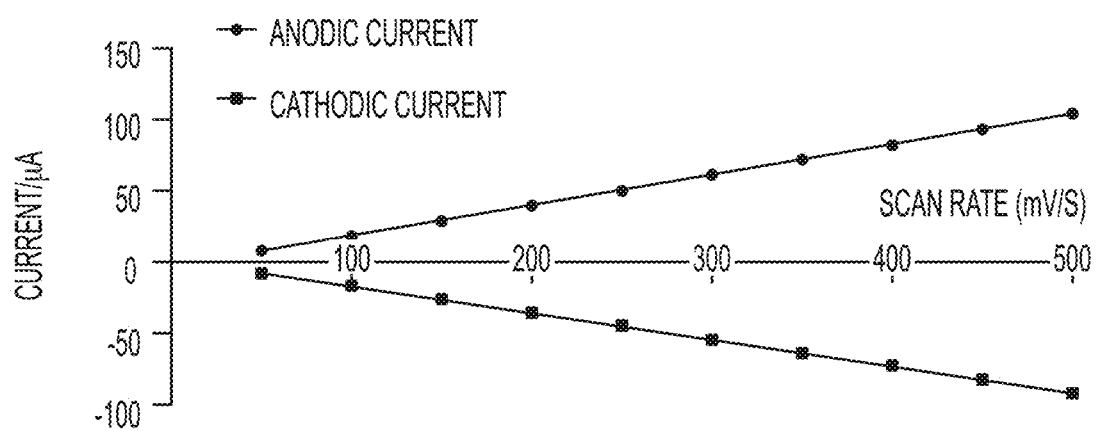
FIG. 12 relates to an aspect of an embodiment of the electrochemical characterization of CNT yarn 3D printed electrodes, wherein a graphical illustration is provided of the relations between the anodic/cathodic peak current and scan rate.
Figure 13:
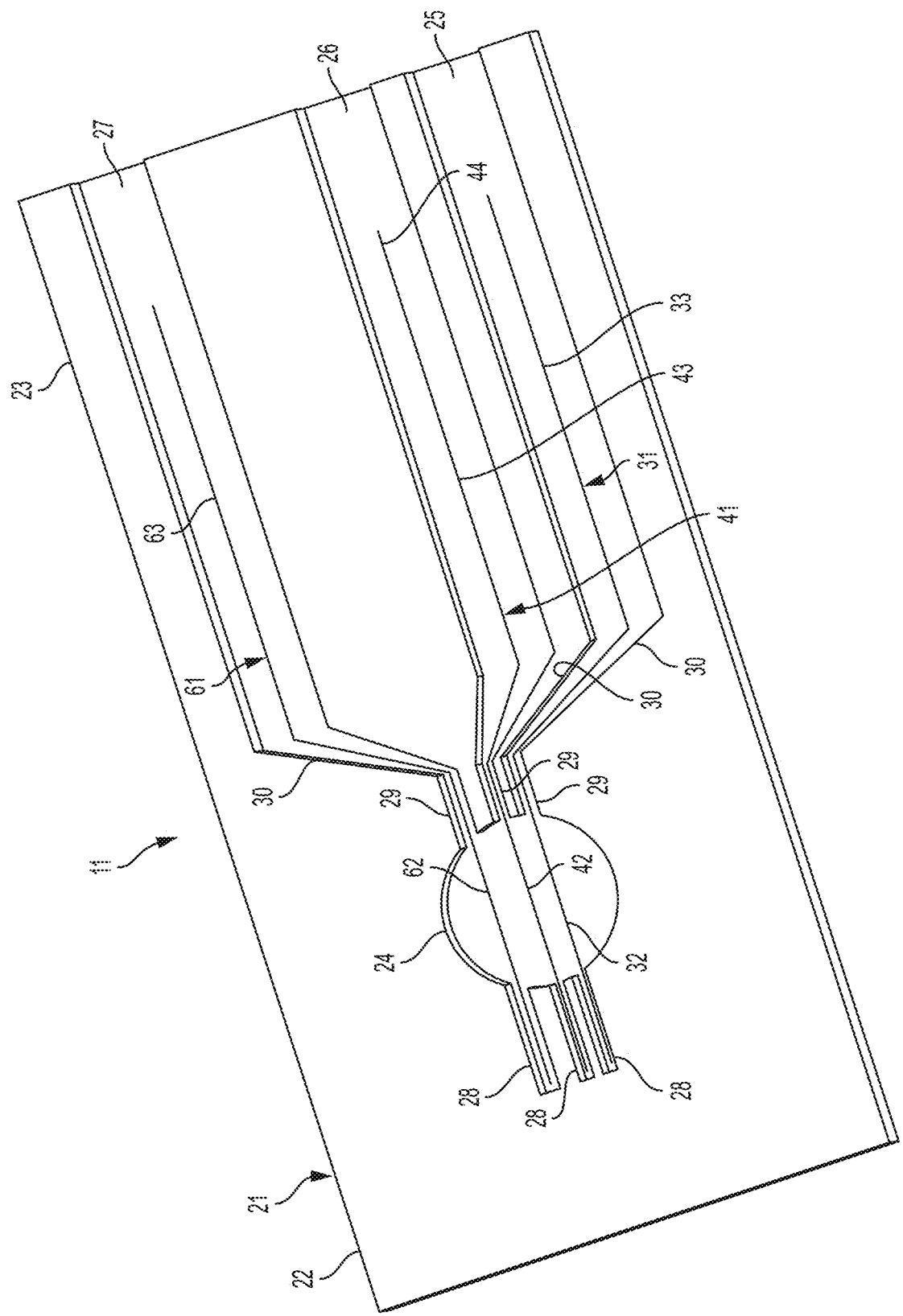
FIG. 13 provides a schematic top perspective view of an aspect of an embodiment of an electrochemical device of the presently disclosed subject matter.
Figure 14:
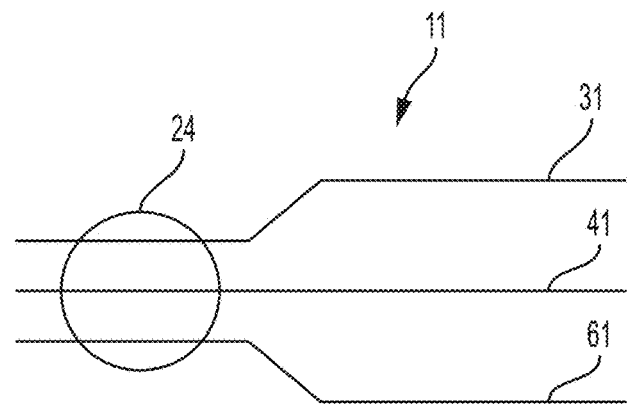
FIG. 14 provides a schematic top view of an aspect of an embodiment of an electrochemical device of the presently disclosed subject matter.
Figure 15:
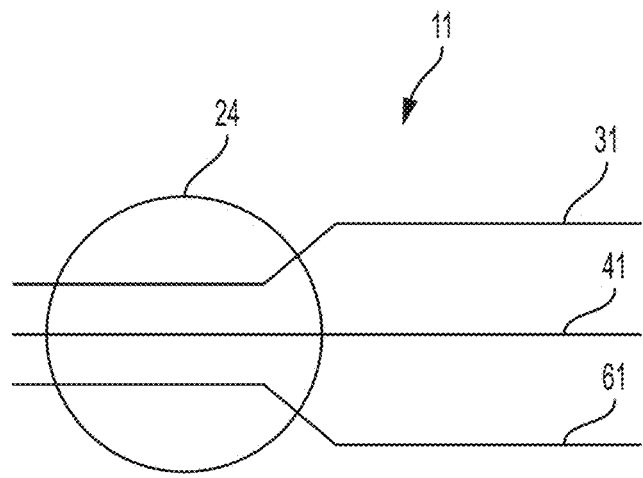
FIG. 15 provides a schematic top view of an aspect of an embodiment similarly disclosed in FIG. 14 having a larger sample region; alternatively located sample region; and/or alternatively shaped, placed or located electrodes, for example.
Figure 16:
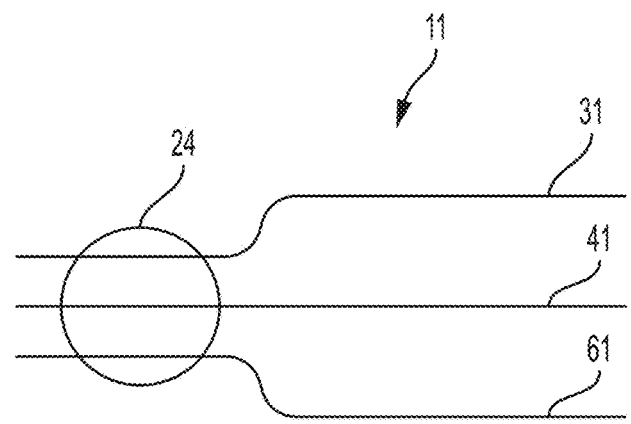
FIG. 16 provides a schematic top view of an aspect of an embodiment of an electrochemical device of the presently disclosed subject matter.
Figure 17:
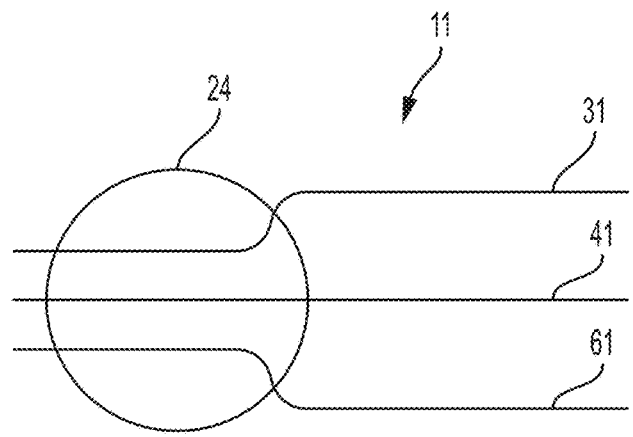
FIG. 17 provides a schematic top view of an aspect of an embodiment similarly disclosed in FIG. 16 having a larger sample region; alternatively located sample region; and/or alternatively shaped, placed or located electrodes, for example.
Figure 18:
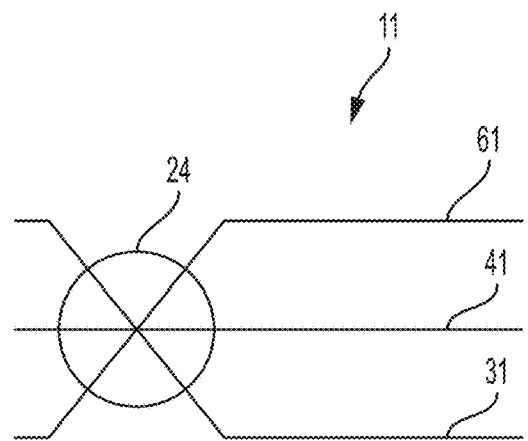
FIG. 18 provides a schematic top view of an aspect of an embodiment of an electrochemical device of the presently disclosed subject matter.
Figure 19:
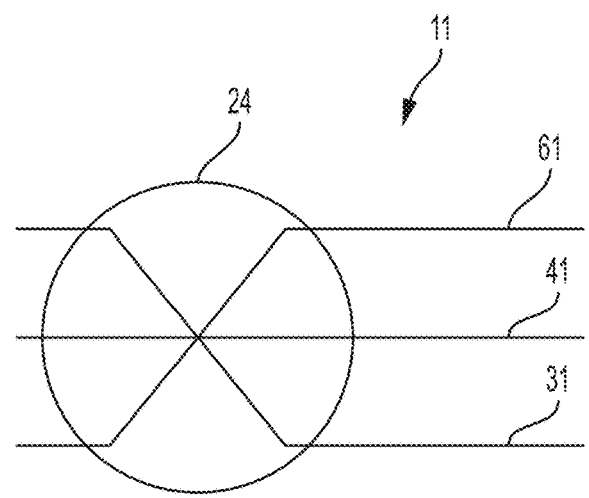
FIG. 19 provides a schematic top view of an aspect of an embodiment similarly disclosed in FIG. 18 having a larger sample region; alternatively located sample region; and/or alternatively shaped, placed or located electrodes, for example.
Figure 20:
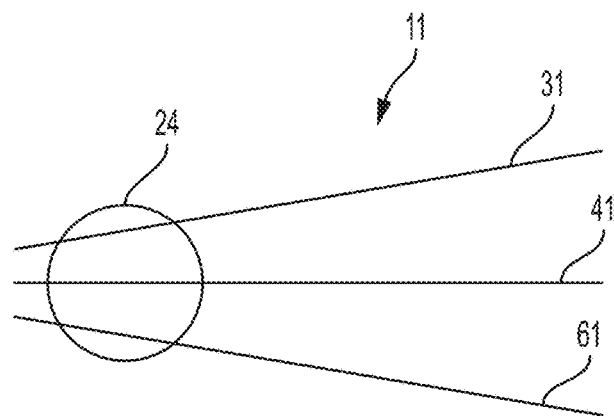
FIG. 20 provides a schematic top view of an aspect of an embodiment of an electrochemical device of the presently disclosed subject matter.
Figure 21:
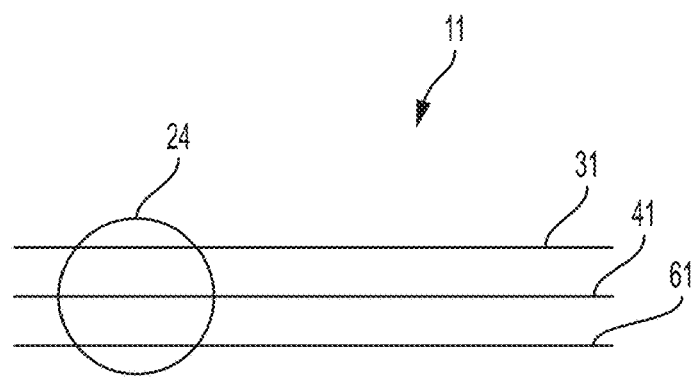
FIG. 21 provides a schematic top view of an aspect of an embodiment of an electrochemical device of the presently disclosed subject matter.
Figure 22:
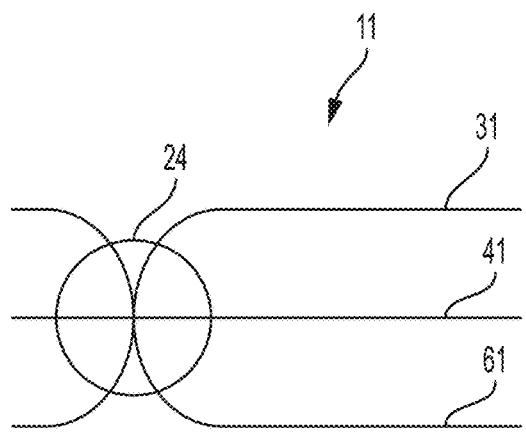
FIG. 22 provides a schematic top view of an aspect of an embodiment of an electrochemical device of the presently disclosed subject matter.

Since most of the CNT yarn studies have only investigated the electrochemical performance at its polished tip, the electroactivity of the sidewall of CNT yarn is not well understood. For example, the redox reaction of dopamine depends on the surface oxygen-containing functional groups, surface roughness, and π-π stacking reversibility. In contrast to most sensor designs, which are based on maximizing exposure of edge plane defects which are on the end of CNT yarn, the novel 3D printing assisted fabrication method provides a platform for the electrochemistry study of the reactivity of CNT sidewalls. The kinetics of electrode reaction were investigated by evaluating the effect of CV scan rate on the DA oxidation and reduction peak currents (see FIG. 10). Both the anodic and cathodic peak currents were proportional to scan rate in the range of 50 to 500 mV/s (see FIG. 12). The linear regression equation for the anodic peak current was $I_{p,a}$ (μA)=2.33+0.21*v (mV/s), with a correlation coefficient of $R^2$=0.9999, and for the cathodic peak current was $I_{p,c}$=−2.74-0.18*v (mV/s), with $R^2$=0.9999. Both DA oxidation and reduction reactions at CNT yarn 3D printed electrodes are adsorption controlled processes, similar to DA redox reaction at the tips of CNT yarn and carbon fiber microelectrodes. The adsorption mechanism of DA reaction on CNTs and carbon fiber is due to the electrostatic interaction with the negatively charged oxygen-containing functional groups under physiological pH. But due to the lack of $sp^3$ hybridized carbons on the pristine CNT yarn sidewall, the π-π stacking between dopamine and CNTs sidewall is likely to play an important role for the adsorption controlled process.

Figure 10:
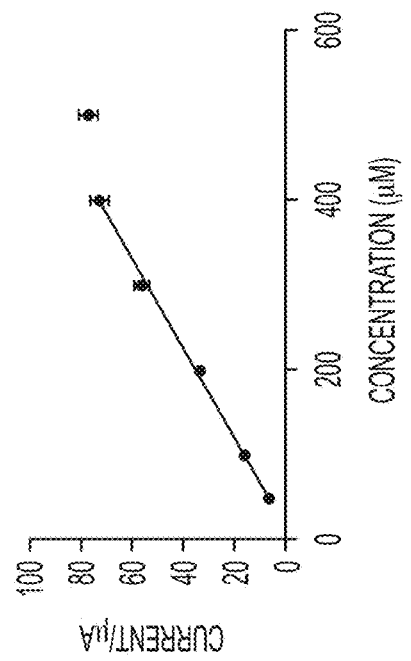
FIG. 10 relates to an aspect of an embodiment of the electrochemical characterization of CNT yarn 3D printed electrodes, wherein a graphical illustration is provided of the stability experiment was performed by testing the response of CNT yarn 3D printed electrodes (n=4) to 300 μM dopamine every day for four days, with scan rate of 200 mV/s from −0.2 to 0.6 V.

A secondary oxidation peak at 160 mV was observed for dopamine with CV, especially at slower scan rate (FIG. 10, black arrow). The secondary oxidation is likely due to the oxidation of leucodopaminechrome (LDAC) to dopaminechrome (DAC), in the synthetic pathway of

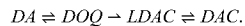

$$DA \rightleftharpoons DOQ \rightarrow LDAC \rightleftharpoons DAC.$$

Similar results have been observed at a long-length (hundred micrometers) CNT electrodes, but not at other carbon electrodes such as carbon paste, graphene, fullerene, nanofiber, and graphite.

The 3D printed electrode method provides a much easier fabrication approach than dispersing and coating long-length CNTs on a substrate made and therefore is a good platform to perform further fundamental electrochemical studies of CNT sidewall reactivity. Overall, the 3D printed electrode fabrication method provides a platform for testing the electrochemical reactivity of any fiber or wire electrode material with ease. The design has revealed interesting good electrocatalytic properties of CNT yarn sidewalls and enhancement of side reactions from cyclization products that are stabilized at the CNTs.

Conclusions

In this work, the present inventors provide a novel 3D printed platform for electrode fabrication that expands the electrochemical application of various fiber materials. The new fabrication method has the advantages of low-cost, customizable design, and high reproducibility. Moreover, the compatibility to existing SPE electrochemistry workstations minimizes the cost because no extra device/instrument is required. A CNT yarn was used as the electrode material. The LOD for DA with CV is less than 1 μM. The CNT yarn electrode demonstrated promising selectivity of DA in the presence of AA and UA, enabling simultaneous detection with CV or DPV. In addition, the good sensitivity and adsorption controlled process for DA demonstrates possible electroactivity of CNTs sidewalls, and indicates the 3D printed electrode method is a good platform for electrochemistry studies on sidewalls which are hard to study with conventional fabrication approaches. Future studies could examine the surface properties and electrochemical performance after pretreatments such as surface modifications or decorated with polymers, metals particle, or biomaterials because the CNT yarn sidewall is a highly homogenous structure for sensing. The new 3D printed platform allows broad application of not only CNT yarn but also other materials such as metal or polymer fibers. 3D printed platforms could also potentially be applied as electrode arrays, which would allow the calibration and the analysis of several analytes simultaneously.

ADDITIONAL EXAMPLES

Example 1. An electrochemical device for identifying at least one electroactive analyte, said device comprising:
a substrate having a sampling end and a connection end of said substrate;
a sample region disposed at said sampling end of said substrate;
a counter electrode disposed in communication with said substrate, wherein said counter electrode having a sample end and a readout end, wherein a counter electrode longitudinal span is defined;
a reference electrode disposed in communication with said substrate, wherein said reference electrode having a sample end and a readout end, wherein a reference electrode longitudinal span is defined;
a working electrode disposed in communication with said substrate, wherein:
said working electrode having a sample end and a readout end, wherein a working electrode longitudinal span is defined, and
said working electrode comprises an electron conducting fiber;
a conductive lead disposed in communication with each of respective readout ends of each of said counter electrode, reference electrode, and working electrode, wherein said conductive lead is configured to allow said counter electrode, reference electrode, and working electrode to communicate with a readout device or other ancillary coupling or transmission channel;
wherein each of respective sample ends of said counter electrode, reference electrode, and working electrode are partially disposed in said sample region configured to be exposed to the electroactive analyte; and
a counter electrode channel, reference electrode channel, and working electrode channel disposed in said substrate configured to:
accommodate each of said counter electrode, reference electrode, and working electrode, respectively, for placement in said respective channels.

Example 2. The device of example 1, wherein at least one or more of any combination of said counter electrode channel, reference electrode channel, and working electrode channel are configured to:
shape said longitudinal spans of said counter electrode, reference electrode, and working electrode, respectively, within said counter electrode channel, reference electrode channel, and working electrode channel, respectively.

Example 3. The device of example 1 (as well as subject matter in whole or in part of example 2), wherein said working electrode channel is configured to:
shape said longitudinal spans of said working electrode within said working electrode channel.

Example 4. The device of example 1 (as well as subject matter of one or more of any combination of examples 2-3, in whole or in part), further comprising a kit, wherein said kit includes:
a readout device;
an ancillary coupling or a transmission channel; or
a readout device and an ancillary coupling or a transmission channel.

Example 5. The device of example 1 (as well as subject matter of one or more of any combination of examples 2-3, in whole or in part), wherein said placed and shaped counter electrode, reference electrode, and working electrode are resultantly aligned for a readout device or other ancillary coupling or transmission channel.

Example 6. The device of example 5 (as well as subject matter of one or more of any combination of examples 2-4, in whole or in part), further comprising a kit, wherein said kit includes.
a readout device;
an ancillary coupling or a transmission channel; or
a readout device and an ancillary coupling or a transmission channel.

Example 7. The device of example 1 (as well as subject matter of one or more of any combination of examples 2-6, in whole or in part), wherein said electron conducting fiber comprises a carbon fiber, a carbon nanotube fiber, a carbon nanotube yarn, a carbon nanotube grown metal microwire, a carbon nanospikes grown metal microwire, or a metal fiber.

Example 8. The device of example 1 (as well as subject matter of one or more of any combination of examples 2-7, in whole or in part), wherein said device is utilized for at least one or more of any combination of the following: biochemical analyses, pharmaceutical analyses, industrial analyses, or environmental analyses.

Example 9. The device of example 8 (as well as subject matter of one or more of any combination of examples 2-7, in whole or in part), wherein for biochemical analyses the electroactive analyte includes at least one or more of any combination of the following: adenosine, histamine, $H_2O_2$, epinephrine, norepinephrine, serotonin, endorphin, dynorphin, neuropeptides, or oxytocin.

Example 10. The device of example 8 (as well as subject matter of one or more of any combination of examples 2-7 and 9, in whole or in part), wherein for pharmaceutical analyses the electroactive analyte includes at least one or more of any combination of the following: DNA, tumor markers, food pathogens, amino acids, carbohydrates, halides, cyanide, thiocyanate, alcohols, or arsenic.

Example 11. The device of example 8 (as well as subject matter of one or more of any combination of examples 2-7 and 9-10, in whole or in part), wherein for industrial analyses the electroactive analyte includes at least one or more of any combination of the following: DNA, tumor markers, food pathogens, amino acids, carbohydrates, halides, cyanide, thiocyanate, alcohols, or arsenic.

Example 12. The device of example 8 (as well as subject matter of one or more of any combination of examples 2-7 and 9-11, in whole or in part), wherein for environmental analyses the electroactive analyte includes at least one or more of any combination of the following: carbohydrates, halides, cyanide, thiocyanate, alcohols, arsenic, or metals.

Example 13. The device of example 1 (as well as subject matter of one or more of any combination of examples 2-12, in whole or in part), wherein the at least one electroactive analyte includes one or more neurochemicals.

Example 14. The device of example 1 (as well as subject matter of one or more of any combination of examples 2-13, in whole or in part), wherein the one or more neurochemicals includes neurotransmitters.

Example 15. The device of example 14 (as well as subject matter of one or more of any combination of examples 2-13, in whole or in part), wherein the neurotransmitter includes at least one or more of any combination of the following:
dopamine (DA), adenosine, histamine, epinephrine, norepinephrine, serotonin, endorphin, neuropeptides, or oxytocin.

Example 16. The device of example 1 (as well as subject matter of one or more of any combination of examples 2-15, in whole or in part), wherein the at least one electroactive analyte includes at least one or more of any combination of the following:
dopamine (DA) in the presence of ascorbic acid (AA), or dopamine (DA) in the presences of uric acid (UA).

Example 17. The device of example 1 (as well as subject matter of one or more of any combination of examples 2-16, in whole or in part), wherein said substrate is produced by 3D printing, laser etching, etching, milling, molding, embossing, or lithography.

Example 18. The device of example 1 (as well as subject matter of one or more of any combination of examples 2-17, in whole or in part), wherein said channels are produced in said substrate by 3D printing, laser etching, etching, milling, molding, embossing, or lithography.

Example 19. The device of example 1 (as well as subject matter of one or more of any combination of examples 2-18, in whole or in part), further comprising.
an adhesive disposed on said counter electrode, reference electrode, and working electrode to attach each of said counter electrode, reference electrode, and working electrode to each of said counter channel, reference channel, and working channel, respectively.

Example 20. The device of example 1 (as well as subject matter of one or more of any combination of examples 2-19, in whole or in part), further comprising:
a seal provided on a portion of each said counter electrode, reference electrode, and working electrode wherein a non-sealed portion is provided whereby said counter electrode, reference electrode, and working electrode is configured to be exposed to electroactive analyte in said sample region.

Example 21. The device of example 1 (as well as subject matter of one or more of any combination of examples 2-20, in whole or in part), wherein said working electrode is a bare wire electrode, graphene, or carbon nanotubes (CNT).

Example 22. The device of example 21 (as well as subject matter of one or more of any combination of examples 2-20, in whole or in part), wherein said CNT working electrode is fabricated by one or more of the following processes: drawing CNTs from CNT array or CNT dry spinning.

Example 23. The device of example 1 (as well as subject matter of one or more of any combination of examples 2-22, in whole or in part), wherein said reference electrode includes at least one or more of any combination of the following: Silver/Silver Chloride (Ag/AgCl), hydrogen (H), or Copper(I)-Copper(II) (Cu(I)-Cu(II).

Example 24. The device of example 23 (as well as subject matter of one or more of any combination of examples 2-22, in whole or in part), wherein said Ag/AgCl reference electrode is fabricated by a processes of chlorination of silver wires.

Example 25. The device of example 1 (as well as subject matter of one or more of any combination of examples 2-24, in whole or in part), wherein said counter electrode comprises a bare wire.

Example 26. The device of example 1 (as well as subject matter of one or more of any combination of examples 2-25, in whole or in part), wherein said counter electrode includes at least one or more of any combination of the following: silver (Ag), copper (Cu), or platinum (Pt).

Example 27. The device of example 1 (as well as subject matter of one or more of any combination of examples 2-26, in whole or in part), wherein the outer surface of said working electrode defines a sidewall and furthest distal end of said working electrode at the sample end defines a tip.

Example 28. A method of making an electrochemical device for identifying at least one electroactive analyte, said method comprising:
providing a substrate having a sampling end and a connection end;
creating a sample region disposed at said sampling end of said substrate;
creating a counter electrode channel, reference electrode channel, and working electrode channel disposed in said substrate;

placing a counter electrode disposed in communication with said counter electrode channel, wherein said counter electrode includes a sample end and a readout end, wherein a counter electrode longitudinal span is defined, and wherein said placement aligns the longitudinal span of said counter electrode;

placing a reference electrode disposed in communication with said reference electrode channel, wherein said reference electrode includes a sample end and a readout end, wherein a reference electrode longitudinal span is defined, and wherein said placement aligns the longitudinal span of said reference electrode;

placing a working electrode disposed in communication with said working electrode channel, wherein:
  said working electrode includes a sample end and a readout end, wherein a working electrode longitudinal span is defined, and wherein said placement aligns the longitudinal span of said working electrode, and
  said working electrode comprises an electron conducting fiber;

disposing a conductive lead in communication with each of respective readout ends of each of said counter electrode, reference electrode, and working electrode, wherein said conductive lead is configured to communicate with a readout device or other ancillary coupling or transmission channel; and wherein each of respective sample ends of said counter electrode, reference electrode, and working electrode are disposed in said sample region configured to be exposed to the electroactive analyte.

Example 29. The method of example 28, wherein said placing said at least one or more of any combination of said counter electrode channel, reference electrode channel, and working electrode channel includes shaping said longitudinal spans of said counter electrode, reference electrode, and working electrode, respectively, within said counter electrode channel, reference electrode channel, and working electrode channel, respectively.

Example 30. The method of example 28 (as well as subject matter in whole or in part of example 29), wherein said placing said working electrode channel includes shaping said longitudinal spans of said working electrode within said working electrode channel.

Example 31. The method of example 28 (as well as subject matter of one or more of any combination of examples 29-30, in whole or in part), wherein said placement for shaping said counter electrode, reference electrode, and working electrode includes aligning them for a readout device or other ancillary coupling or transmission channel.

Example 32. The method of example 28 (as well as subject matter of one or more of any combination of examples 29-31, in whole or in part), wherein:
  said creating said channels is provided by lithographically contouring said substrate, etching said substrate, molding said substrate, or 3D printing said substrate.

Example 33. The method of example 28 (as well as subject matter of one or more of any combination of examples 29-32, in whole or in part), further comprising:
  disposing an adhesive on said counter electrode, reference electrode, and working electrode to attach each of said counter electrode, reference electrode, and working electrode to each of said counter channel, reference channel, and working channel, respectively.

Example 34. The method of example 28 (as well as subject matter of one or more of any combination of examples 29-33, in whole or in part), further comprising:

sealing a portion of each said counter electrode, reference electrode, and working electrode wherein a non-sealed portion is provided whereby said counter electrode, reference electrode, and working electrode is configured to be exposed to electroactive analyte in said sample region.

Example 35. An electrochemical device for identifying at least one electroactive analyte, said device comprising:
  a substrate;
  a sample region disposed at said substrate;
  a counter electrode disposed in communication with said substrate;
  a reference electrode disposed in communication with said substrate;
  a working electrode disposed in communication with said substrate, and said working electrode comprises an electron conducting fiber;
  wherein said counter electrode, reference electrode, and working electrode are partially disposed in said sample region configured to be exposed to the electroactive analyte; and
  a counter electrode channel, reference electrode channel, and working electrode channel disposed in said substrate configured to:
    accommodate each of said counter electrode, reference electrode, and working electrode, respectively, for placement in said respective channels.

Example 36. The device of example 35, wherein at least one or more of any combination of said counter electrode channel, reference electrode channel, and working electrode channel are configured to:
  shape said counter electrode, reference electrode, and working electrode, respectively, within said counter electrode channel, reference electrode channel, and is working electrode channel, respectively.

Example 37. The device of example 35 (as well as subject matter in whole or in part of example 36), wherein said working electrode channel is configured to:
  shape said working electrode within said working electrode channel.

Example 38. The device of example 35 (as well as subject matter of one or more of any combination of examples 36-37, in whole or in part), further a conductive lead disposed in communication with each of said counter electrode, reference electrode, and working electrode.

Example 39. The device of example 38 (as well as subject matter of one or more of any combination of examples 36-37, in whole or in part), wherein each of said conductive lead is configured to allow said counter electrode, reference electrode, and working electrode to communicate with a readout device or other ancillary coupling or transmission channel Example 40. A method of making an electrochemical device for identifying at least one electroactive analyte, said method comprising:
  providing a substrate having a sampling end and a connection end;
  creating a sample region disposed at said sampling end of said substrate;
  creating a counter electrode channel, reference electrode channel, and working electrode channel disposed in said substrate;
  placing a counter electrode disposed in communication with said counter electrode channel, and wherein said placement aligns the said counter electrode;
  placing a reference electrode disposed in communication with said reference electrode channel, and wherein said placement aligns the said reference electrode;

placing a working electrode disposed in communication with said working electrode channel, and wherein said placement aligns said working electrode, and said working electrode comprises an electron conducting fiber; and wherein portions of each said counter electrode, reference electrode, and working electrode are disposed in said sample region configured to be exposed to the electroactive analyte.

Example 41. The method of example 40, wherein said placing said at least one or more of any combination of said counter electrode channel, reference electrode channel, and working electrode channel includes shaping said counter electrode, reference electrode, and working electrode, respectively, within said counter electrode channel, reference electrode channel, and working electrode channel, respectively.

Example 42. The method of example 40 (as well as subject matter in whole or in part of example 41), wherein said placing said working electrode channel includes shaping said working electrode within said working electrode channel.

Example 43. The method of example 40 (as well as subject matter of one or more of any combination of examples 41-42, in whole or in part), wherein said placement for shaping said counter electrode, reference electrode, and working electrode includes aligning them for a readout device or other ancillary coupling or transmission channel.

Example 44. The method of example 40 (as well as subject matter of one or more of any combination of examples 41-43, in whole or in part), further comprising disposing a conductive lead in communication with each of said counter electrode, reference electrode, and working electrode Example 45. The method of example 44 (as well as subject matter of one or more of any combination of examples 41-43, in whole or in part), wherein each of said conductive lead is configured to communicate with a readout device or other ancillary coupling or transmission channel.

Example 46. The method of using any of the devices, systems, apparatuses, assemblies, or their components provided in any one or more of examples 1-27 and 35-39.

Example 47. The method of manufacturing any of the devices, systems, apparatuses, assemblies, or their components provided in any one or more of examples 1-27 and 35-39.

Example 48. An apparatus including subject matter of one or more of any combination of examples 1-27 and 35-39, in whole or in part.

Example 49. An electrochemical device for identifying at least one electroactive analyte, wherein said device comprises: a substrate having a sampling end and a connection end of said substrate; a sample region disposed at said sampling end of said substrate; a counter electrode disposed in communication with said substrate, wherein said counter electrode having a sample end and a readout end, wherein a counter electrode longitudinal span is defined; a reference electrode disposed in communication with said substrate, wherein said reference electrode having a sample end and a readout end, wherein a reference electrode longitudinal span is defined; a working electrode disposed in communication with said substrate, wherein:said working electrode having a sample end and a readout end, wherein a working electrode longitudinal span is defined, and said working electrode comprises an electron conducting fiber. The electrochemical device further comprises a counter electrode channel, reference electrode channel, and working electrode channel are disposed in said substrate, wherein said counter electrode channel, said reference electrode channel, and said working electrode channel each form a recess disposed in said substrate. Further, wherein the electrochemical device further comprises: i) said counter electrode channel comprises: a counter electrode distal neck channel in communication with said sample region located on said sample region toward the sampling end of said substrate, wherein said counter electrode distal neck channel forms a recess disposed in said substrate, ii) said reference electrode channel comprises: a reference electrode distal neck channel in communication with said sample region located on said sample region toward the sampling end of said substrate, wherein said reference electrode distal neck channel forms a recess disposed in said substrate, and iii) said working electrode channel comprises: a working electrode distal neck channel in communication with said sample region located on said sample region toward the sampling end of said substrate, wherein said working electrode distal neck channel forms a recess disposed in said substrate. Further yet, the electrochemical device further comprises a conductive lead disposed in communication with each of respective readout ends of each of said counter electrode, reference electrode, and working electrode, wherein said conductive lead is configured to allow said counter electrode, reference electrode, and working electrode to communicate with a readout device or other ancillary coupling or transmission channel Further still, wherein each of respective sample ends of said counter electrode, reference electrode, and working electrode are partially disposed in said sample region configured to be exposed to the electroactive analyte. Additionally, wherein said counter electrode channel, said reference electrode channel, and said working electrode channel are configured to: receive the entire span of each of said counter electrode, said reference electrode, and said working electrode, respectively, for placement in each of said recesses of said respective electrode channels and said respective distal neck channels.

REFERENCES

The devices, systems, apparatuses, compositions, materials, machine readable medium, computer program products, and methods of various embodiments of the invention disclosed herein may utilize aspects disclosed in the following references, applications, publications and patents and which are hereby incorporated by reference herein in their entirety, and which are not admitted to be prior art with respect to the present invention by inclusion in this section:

[1] T. H. Lücking, F. Sambale, S. Beutel, and T. Scheper, "3D-printed individual labware in biosciences by rapid prototyping: A proof of principle," Eng. Life Sci., pp. 51-56, 2014.

[2] S. Sandron et al., "3D printed metal columns for capillary liquid chromatography," Analyst, vol. 139, no. 24, pp. 6343-6347, September 2014.

[3] P. Yager et al., "Microfluidic diagnostic technologies for global public health," vol. 442, no. July, 2006.

[4] T. R. Cook, D. K. Dogutan, S. Y. Reece. Y. Surendranath, T. S. Teets, and D. G. Nocera. "Solar Energy Supply and Storage for the Legacy and Nonlegacy Worlds," Chem. Rev., pp. 6474-6502, 2010.

[5] K. Lee, S. Wang, M. Dadsetan, M. J. Yaszemski, and L. Lu, "Enhanced Cell Ingrowth and Proliferation through Three-Dimensional Nanocomposite Scaffolds with Controlled Pore Structures," Biomacromolecules, vol. 11, pp. 682-689, 2010.

[6] M. S. Mannoor et al., "3D Printed Bionic Ears," Nano Lett., vol. 13, p. 2634-2639, 2013.

[7] D. Therriault, S. R. White, and J. A. Lewis, "Chaotic mixing in three-dimensional microvascular networks fabricated by direct-write assembly," vol. 2, no. April, pp. 265-272, 2003.

[8] J. Mackinnon and J. Daurka, "Use of 3D printing in orthopaedic surgery," vol. 2963, no. May, p. 2963, 2014.

[9] L. H. Hsu, G. F. Huang, C. T. Lu, D. Y. Hong, and S. H. Liu, "The development of a rapid prototyping prosthetic socket coated with a resin layer for transtibial amputees," vol. 34, no. March, pp. 37-45, 2010.

[10] C. Zhao, C. Wang, R. G. Iii, S. Beime, K. Shu, and G. G. Wallace, "Electrochemistry Communications Three dimensional (3D) printed electrodes for interdigitated supercapacitors." Electrochem. commun., vol. 41, pp. 20-23, 2014.

[11] M. D. Symes et al., "Integrated 3D-printed reactionware for chemical synthesis and analysis Mark," Nat. Chem., vol. 4, no. 5, pp. 349-354, 2012.

[12] A. Ambrosi and M. Pumera, "3D-printing technologies for electrochemical applications," Chem. Soc. Rev., vol. 45, no. 10, pp. 2740-2755, 2016.

[13] B. M. Geissler and Y. Xia, "Patterning: Principles and Some New Developments," no. 15, pp. 1249-1269, 2004.

[14] E. Trikantzopoulos, C. Yang, M. Ganesana, Y. Wang, and B. J. Venton, "Novel carbon-fiber microelectrode batch fabrication using a 3D-printed mold and polyimide resin," Analyst, vol. 141, no. 18, pp. 5256-5260, 2016.

[15] C. Yang, M. E. Denno. P. Pyakurel, and B. J. Venton, Recent trends in carbon nanomaterial-based electrochemical sensors for biomolecules: A review, vol. 887. 2015, pp. 17-37.

[16] J. Ping, J. Wu, Y. Wang, and Y. Ying, "Simultaneous determination of ascorbic acid, dopamine and uric acid using high-performance screen-printed graphene electrode," Biosens. Bioelectron., vol. 34, no. 1, pp. 70-6, April 2012.

[17] M. Moussa et al., "CAD/CAM—designed 3D-printed electroanalytical cell for the evaluation of nanostructured gas-diffusion electrodes," Nanotechnology, vol. 27, no. 17, p. 0.

[18] R. Amin et al., "3D-printed bioanalytical devices," Nanotechnology, vol. 27, no. 28, pp. 1-8.

[19] P. R Miller, X. Xiao, I. Brener, D. B. Burckel, and R Narayan, "Microneedle-Based Transdermal Sensor for On-Chip Potentiometric Determination of K +," pp. 876-881, 2014.

[20] J.-C. Chen, H.-H. Chung, C.-T. Hsu, D.-M. Tsai, A. S. Kumar, and J.-M. Zen, "A disposable single-use electrochemical sensor for the detection of uric acid in human whole blood," Sensors Actuators B, vol. 110, pp. 364-369, 2005.

[21] J. J. Vilatela and R. Marcilla, "Tough Electrodes: Carbon Nanotube Fibers as the Ultimate Current Collectors/Active Material for Energy Management Devices," Chem. Mater., vol. 27, no. 20, pp. 6901-6917, 2015.

[22] W. Lu, M. Zu, J. H. Byun, B. S. Kim, and T. W. Chou, "State of the art of carbon nanotube fibers: Opportunities and challenges," Adv. Mater., vol. 24, no. 14, pp. 1805-1833, 2012.

[23] N. Behabtu, M. J. Green, and M. Pasquali, "Carbon nanotube-based neat fibers," Nano Today, vol. 3, no. 5-6, pp. 24-34, 2008.

[24] W. Harreither, R. Trouillon, P. Poulin, W. Neri, A. G. Ewing, and G. Safina, "Carbon Nanotube Fiber Microelectrodes Show a Higher Resistance to Dopamine Fouling," Anal. Chem., vol. 85, no. 15, pp. 7447-7453. August 2013.

[25] C. Yang et al., "Carbon Nanotubes Grown on Metal Microelectrodes for the Detection of Dopamine," Anal. Chem., vol. 88, no. 1, pp. 645-652, 2016.

[26] A. C. Schmidt, X. Wang, Y. Zhu, and L. a Sombers, "Carbon Nanotube Yarn Electrodes for Enhanced Detection of Neurotransmitter Dynamics in Live Brain Tissue.," ACS Nano, pp. 7864-7873, August 2013.

[27] C. B. Jacobs, I. N. Ivanov, M. D. Nguyen, A. G. Zestos, and B. J. Venton, "High temporal resolution measurements of dopamine with carbon nanotube yarn microelectrodes," Anal. Chem., vol. 86, no. 12, pp. 5721-5727, 2014.

[28] I. Dumitrescu, P. R. Unmin, and J. V Macpherson, "Electrochemistry at carbon nanotubes: perspective and issues," Chem. Commun. (Camb)., vol. 7345, no. 45, pp. 6886-901, December 2009.

[29] J. Kim, H. Xiong, M. Hofmann, J. Kong, and S. Amemiya, "Letters to Analytical Chemistry Scanning Electrochemical Microscopy of Individual Single-Walled Carbon Nanotubes," vol. 82, no. 5, pp. 1605-1607, 2010.

[30] J. C. Byers, A. G. Guell, and P. R. Unwin, "Nanoscale Electrocatalysis: Visualizing Oxygen Reduction at Pristine, Kinked, and Oxidized Sites on Individual Carbon Nanotubes," J. Am. Chem. Soc., vol. 136, no. 32, pp. 11252-11255, August 2014.

[31] A. G. Güell, K. E. Meadows, P. V. Dudin, N. Ebejer, J. V. Macpherson, and P. R. Unwin, "Mapping Nanoscale Electrochemistry of Individual Single-Walled Carbon Nanotubes," Nano Lett., vol. 14, no. 1, pp. 220-224, January 2014.

[32] M. Mazloum-Ardakani, H. Beitollahi, B. Ganjipour, H. Naeimi, and M. Nejati, "Electrochemical and catalytic investigations of dopamine and uric acid by modified carbon nanotube paste electrode," Bioelectrochemistry, vol. 75, no. 1, pp. 1-8, April 2009.

[33] I. Banerjee, R. C. Pangule, and R. S. Kane, "Antifouling coatings: Recent developments in the design of surfaces that prevent fouling by proteins, bacteria, and marine organisms." Adv. Mater., vol. 23, no. 6, pp. 690-718, 2011.

[34] A. G. Zestos, C. B. Jacobs, E. Trikantzopoulos, A. E. Ross, and B. J. Venton, "Polyethylenimine carbon nanotube fiber electrodes for enhanced detection of neurotransmitters," Anal. Chem., vol. 86, no. 17, pp. 8568-8575, 2014.

[35] C. Yang et al., "Laser Treated Carbon Nanotube Yarn Microelectrodes for Rapid and Sensitive Detection of Dopamine in Vivo," ACS Sensors, vol. 1, no. 5, pp. 508-515, May 2016.

[36] M. Cao et al., "Electrochemical and Theoretical Study of $\pi$-$\pi$ Stacking Interactions between Graphitic Surfaces and Pyrene Derivatives," J. Phys. Chem. C, vol. 118, no. 5, pp. 2650-2659, February 2014.

[37] S. B. Hočevar, J. Wang, R P. Deo, M. Musameh, and B. Ogorevc. "Carbon nanotube modified microelectrode for enhanced voltammetric detection of dopamine in the presence of ascorbate," Electroanalysis, vol. 17, no. 5-6, pp. 417-422, 2005.

[38] B. E. K. Swamy and B. J. Venton, "Carbon nanotube-modified microelectrodes for simultaneous detection of dopamine and serotonin in vivo.," Analyst, vol. 132, no. 9, pp. 876-84, September 2007.

[39] P. Takmakov et al., "Carbon microelectrodes with a renewable surface." Anal. Chem., vol. 82, no. 5, pp. 2020-8, March 2010.

[40] N. Xiao and B. Venton, "Rapid, sensitive detection of neurotransmitters at microelectrodes modified with self-assembled SWCNT forests," Anal. Chem., vol. 84, no. 18, pp. 7816-22, September 2012.

[41] R. L. McCreery, "Advanced carbon electrode materials for molecular electrochemistry," Chem. Rev., vol. 108, no. 7, pp. 2646-87, July 2008.

[42] B. J. J. Venton, K. P. K. P. Troyer, and R. M. M. Wightman, "Response times of carbon fiber microelectrodes to dynamic changes in catecholamine concentration," Anal. Chem., vol. 74, no. 3, pp. 539-546, 2002.

[43] H. Muguruma, Y. Inoue, H. Inoue, and T. Ohsawa, "Electrochemical Study of Dopanune at Electrode Fabricated by Cellulose-Assisted Aqueous Dispersion of Long-Length Carbon Nanotube," J. Phys. Chem. C, vol. 120, no. 22, pp. 12284-12292, 2016.

[44] A. Hayat and J. L. Marty, "Disposable screen printed electrochemical sensors: Tools for environmental monitoring," Sensors (Switzerland), vol. 14, no. 6, pp. 10432-10453, 2014.

[45] M. Li, Y. T. Li, D. W. Li, and Y. T. Long, "Recent developments and applications of screen-printed electrodes in environmental assays-A review," Anal. Chim. Acta, vol. 734, pp. 31-44, 2012.

[46] Yang, C., et al., "High Performance, Low Cost Carbon Nanotube Yarn based 3D Printed Electrodes Compatible with a Conventional Screen Printed Electrode System". 2017, IEEE.

[47] U.S. Pat. No. 6,670,115 B1, Zhang, H., "Devices and Methods for Detecting Analytes Using Electrosensor Having Capture Reagent", Dec. 30, 2003.

[48] U.S. Pat. No. 6,063,259, Wang, J., et al., "Microfabricated Thick-Film Electrochemical Sensor for Nucleic Acid Determination", May 16, 2000.

Unless clearly specified to the contrary, there is no requirement for any particular described or illustrated activity or element, any particular sequence or such activities, any particular size, speed, material, duration, contour, dimension or frequency, or any particularly interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. It should be appreciated that aspects of the present invention may have a variety of sizes, contours, shapes, compositions and materials as desired or required.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the following claims, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

We claim:

1. An electrochemical device for identifying at least one electroactive analyte, said device comprising:
    a substrate having a sampling end and a connection end of said substrate;
    a sample region disposed at said sampling end of said substrate;
    a counter electrode disposed in communication with said substrate, wherein said counter electrode having a sample end and a readout end, wherein a counter electrode longitudinal span is defined;
    a reference electrode disposed in communication with said substrate, wherein said reference electrode having a sample end and a readout end, wherein a reference electrode longitudinal span is defined;
    a working electrode disposed in communication with said substrate, wherein:
        said working electrode having a sample end and a readout end, wherein a working electrode longitudinal span is defined, and
        said working electrode comprises an electron conducting fiber;
    a counter electrode channel, reference electrode channel, and working electrode channel are disposed in said substrate, wherein said counter electrode channel, said reference electrode channel, and said working electrode channel each form a recess disposed in said substrate;
    wherein:
        i) said counter electrode channel comprises:

a counter electrode distal neck channel in communication with said sample region located on said sample region toward the sampling end of said substrate, wherein said counter electrode distal neck channel forms a recess disposed in said substrate,
ii) said reference electrode channel comprises:
a reference electrode distal neck channel in communication with said sample region located on said sample region toward the sampling end of said substrate, wherein said reference electrode distal neck channel forms a recess disposed in said substrate, and
iii) said working electrode channel comprises:
a working electrode distal neck channel in communication with said sample region located on said sample region toward the sampling end of said substrate, wherein said working electrode distal neck channel forms a recess disposed in said substrate;
a conductive lead disposed in communication with each of respective readout ends of each of said counter electrode, reference electrode, and working electrode, wherein said conductive lead is configured to allow said counter electrode, reference electrode, and working electrode to communicate with a readout device or other ancillary coupling or transmission channel;
wherein each of respective sample ends of said counter electrode, reference electrode, and working electrode are partially disposed in said sample region configured to be exposed to the electroactive analyte; and
wherein said counter electrode channel, said reference electrode channel, and said working electrode channel are configured to:
receive the entire span of each of said counter electrode, said reference electrode, and said working electrode, respectively, for placement in each of said recesses of said respective electrode channels and said respective distal neck channels.

2. The device of claim 1, further comprising a kit, wherein said kit includes:
a readout device;
an ancillary coupling or a transmission channel; or
a readout device and an ancillary coupling or a transmission channel.

3. The device of claim 1, wherein said placed counter electrode, reference electrode, and working electrode are resultantly aligned for a readout device or other ancillary coupling or transmission channel.

4. The device of claim 3, further comprising a kit, wherein said kit includes:
a readout device;
an ancillary coupling or a transmission channel; or
a readout device and an ancillary coupling or a transmission channel.

5. The device of claim 1, wherein said electron conducting fiber comprises a carbon fiber, a carbon nanotube fiber, a carbon nanotube yarn, a carbon nanotube grown metal microwire, a carbon nanospikes grown metal microwire, or a metal fiber.

6. The device of claim 1, wherein said device is utilized for at least one or more of any combination of the following: biochemical analyses, pharmaceutical analyses, industrial analyses, or environmental analyses.

7. The device of claim 6, wherein for biochemical analyses the electroactive analyte includes at least one or more of any combination of the following: adenosine, histamine, $H_2O_2$, epinephrine, norepinephrine, serotonin, endorphin, dynorphin, neuropeptides, or oxytocin.

8. The device of claim 6, wherein for pharmaceutical analyses the electroactive analyte includes at least one or more of any combination of the following: DNA, tumor markers, food pathogens, amino acids, carbohydrates, halides, cyanide, thiocyanate, alcohols, or arsenic.

9. The device of claim 6, wherein for industrial analyses the electroactive analyte includes at least one or more of any combination of the following: DNA, tumor markers, food pathogens, amino acids, carbohydrates, halides, cyanide, thiocyanate, alcohols, or arsenic.

10. The device of claim 6, wherein for environmental analyses the electroactive analyte includes at least one or more of any combination of the following: carbohydrates, halides, cyanide, thiocyanate, alcohols, arsenic, or metals.

11. The device of claim 1, wherein the at least one electroactive analyte includes one or more neurochemicals.

12. The device of claim 1, wherein the one or more neurochemicals includes neurotransmitters.

13. The device of claim 12, wherein the neurotransmitter includes at least one or more of any combination of the following:
dopamine (DA), adenosine, histamine, epinephrine, norepinephrine, serotonin, endorphin, neuropeptides, or oxytocin.

14. The device of claim 1, wherein the at least one electroactive analyte includes at least one or more of any combination of the following:
dopamine (DA) in the presence of ascorbic acid (AA), or dopamine (DA) in the presences of uric acid (UA).

15. The device of claim 1, wherein said substrate is produced by 3D printing, laser etching, etching, milling, molding, embossing, or lithography.

16. The device of claim 1, wherein said channels are produced in said substrate by 3D printing, laser etching, etching, milling, molding, embossing, or lithography.

17. The device of claim 1, further comprising:
an adhesive disposed on said counter electrode, reference electrode, and working electrode to attach each of said counter electrode, reference electrode, and working electrode to each of said counter channel, reference channel, and working channel, respectively.

18. The device of claim 1, further comprising:
a seal provided on a portion of each said counter electrode, reference electrode, and working electrode wherein a non-sealed portion is provided whereby said counter electrode, reference electrode, and working electrode is configured to be exposed to electroactive analyte in said sample region.

19. The device of claim 1, wherein said working electrode is a bare wire electrode, graphene, or carbon nanotubes (CNT).

20. The device of claim 19, wherein said CNT working electrode is fabricated by one or more of the following processes: drawing CNTs from CNT array or CNT dry spinning.

21. The device of claim 1, wherein said reference electrode includes at least one or more of any combination of the following: Silver/Silver Chloride (Ag/AgCl), hydrogen (H), or Copper (I)-Copper (II) (Cu(I)-Cu(II)).

22. The device of claim 21, wherein said Ag/AgCl reference electrode is fabricated by a processes of chlorination of silver wires.

23. The device of claim 1, wherein said counter electrode comprises a bare wire.

24. The device of claim 1, wherein said counter electrode includes at least one or more of any combination of the following: silver (Ag), copper (Cu), or platinum (Pt).

25. The device of claim 1, wherein the outer surface of said working electrode defines a sidewall and furthest distal end of said working electrode at the sample end defines a tip.

26. A method of making an electrochemical device for identifying at least one electroactive analyte, said method comprising:
providing a substrate having a sampling end and a connection end;
creating a sample region disposed at said sampling end of said substrate;
creating a counter electrode channel, reference electrode channel, and working electrode channel disposed in said substrate, wherein said counter electrode channel, said reference electrode channel, and said working electrode channel each form a recess disposed in said substrate;
wherein:
i) said counter electrode channel comprises:
a counter electrode distal neck channel in communication with said sample region located on said sample region toward the sampling end of said substrate, wherein said counter electrode distal neck channel forms a recess disposed in said substrate,
ii) said reference electrode channel comprises:
a reference electrode distal neck channel in communication with said sample region located on said sample region toward the sampling end of said substrate, wherein said reference electrode distal neck channel forms a recess disposed in said substrate, and
iii) said working electrode channel comprises:
a working electrode distal neck channel in communication with said sample region located on said sample region toward the sampling end of said substrate, wherein said working electrode distal neck channel forms a recess disposed in said substrate;
placing a counter electrode in said recess of said counter electrode channel, wherein said counter electrode includes a sample end and a readout end, wherein a counter electrode longitudinal span is defined, and wherein said placement aligns the longitudinal span of said counter electrode;
placing a reference electrode in said recess of said reference electrode channel, wherein said reference electrode includes a sample end and a readout end, wherein a reference electrode longitudinal span is defined, and wherein said placement aligns the longitudinal span of said reference electrode;
placing a working electrode in said recess of said working electrode channel, wherein:
said working electrode includes a sample end and a readout end, wherein a working electrode longitudinal span is defined, and wherein said placement aligns the longitudinal span of said working electrode,
said working electrode comprises an electron conducting fiber;
wherein said counter electrode channel, said reference electrode channel, and said working electrode channel are configured to:
receive the entire span of each of said counter electrode, said reference electrode, and said working electrode, respectively, for said placement in each of said recesses of said respective electrode channels and said respective distal neck channels;
disposing a conductive lead in communication with each of respective readout ends of each of said counter electrode, reference electrode, and working electrode, wherein said conductive lead is configured to communicate with a readout device or other ancillary coupling or transmission channel; and
wherein each of respective sample ends of said counter electrode, reference electrode, and working electrode are disposed in said sample region configured to be exposed to the electroactive analyte.

27. The method of claim 26, wherein said placement of said counter electrode, reference electrode, and working electrode includes aligning them for a readout device or other ancillary coupling or transmission channel.

28. The method of claim 26, wherein:
said creating said channels is provided by lithographically contouring said substrate, etching said substrate, molding said substrate, or 3D printing said substrate.

29. The method of claim 26, further comprising:
disposing an adhesive on said counter electrode, reference electrode, and working electrode to attach each of said counter electrode, reference electrode, and working electrode to each of said counter channel, reference channel, and working channel, respectively.

30. The method of claim 26, further comprising:
sealing a portion of each said counter electrode, reference electrode, and working electrode wherein a non-sealed portion is provided whereby said counter electrode, reference electrode, and working electrode is configured to be exposed to electroactive analyte in said sample region.

31. An electrochemical device for identifying at least one electroactive analyte, said device comprising:
a substrate having a sampling end and a connection end of said substrate;
a sample region disposed at said substrate;
a counter electrode disposed in communication with said substrate;
a reference electrode disposed in communication with said substrate;
a working electrode disposed in communication with said substrate, and said working electrode comprises an electron conducting fiber;
a counter electrode channel, reference electrode channel, and working electrode channel are disposed in said substrate, wherein said counter electrode channel, said reference electrode channel, and said working electrode channel each form a recess disposed in said substrate;
wherein:
i) said counter electrode channel comprises:
a counter electrode distal neck channel in communication with said sample region located on said sample region toward the sampling end of said substrate, wherein said counter electrode distal neck channel forms a recess disposed in said substrate,
ii) said reference electrode channel comprises:
a reference electrode distal neck channel in communication with said sample region located on said sample region toward the sampling end of said substrate, wherein said reference electrode distal neck channel forms a recess disposed in said substrate, and
iii) said working electrode channel comprises:
a working electrode distal neck channel in communication with said sample region located on said sample region toward the sampling end of said substrate, wherein said working electrode distal neck channel forms a recess disposed in said substrate;

wherein said counter electrode, reference electrode, and working electrode are partially disposed in said sample region configured to be exposed to the electroactive analyte; and wherein said counter electrode channel, said reference electrode channel, and said working electrode channel are configured to:
  receive the entire span of each of said counter electrode, said reference electrode, and said working electrode, respectively, for placement in each of said recesses of said respective electrode channels and said respective distal neck channels.

32. The device of claim 31, further a conductive lead disposed in communication with each of said counter electrode, reference electrode, and working electrode.

33. The device of claim 32, wherein each of said conductive lead is configured to allow said counter electrode, reference electrode, and working electrode to communicate with a readout device or other ancillary coupling or transmission channel.

34. A method of making an electrochemical device for identifying at least one electroactive analyte, said method comprising:
  providing a substrate having a sampling end and a connection end;
  creating a sample region disposed at said sampling end of said substrate;
  creating a counter electrode channel, reference electrode channel, and working electrode channel disposed in said substrate, wherein said counter electrode channel, said reference electrode channel, and said working electrode channel each form a recess disposed in said substrate;
  wherein:
    i) said counter electrode channel comprises:
      a counter electrode distal neck channel in communication with said sample region located on said sample region toward the sampling end of said substrate, wherein said counter electrode distal neck channel forms a recess disposed in said substrate,
    ii) said reference electrode channel comprises:
      a reference electrode distal neck channel in communication with said sample region located on said sample region toward the sampling end of said substrate, wherein said reference electrode distal neck channel forms a recess disposed in said substrate, and
    iii) said working electrode channel comprises:
      a working electrode distal neck channel in communication with said sample region located on said sample region toward the sampling end of said substrate, wherein said working electrode distal neck channel forms a recess disposed in said substrate;
  placing a counter electrode in said recess of said counter electrode channel, and wherein said placement aligns said counter electrode;
  placing a reference electrode in said recess of said reference electrode channel, and wherein said placement aligns the said reference electrode;
  placing a working electrode in said recess of said working electrode channel, and wherein said placement aligns said working electrode, and said working electrode comprises an electron conducting fiber;
  wherein said counter electrode channel, said reference electrode channel, and said working electrode channel, are configured to:
    receive the entire span of each of said counter electrode, said reference electrode, and said working electrode, respectively, for said placement in each of said recesses of said respective electrode channels and said respective distal neck channels; and
  wherein portions of each said counter electrode, reference electrode, and working electrode are disposed in said sample region configured to be exposed to the electroactive analyte.

35. The method of claim 34, wherein said placement of said counter electrode, reference electrode, and working electrode includes aligning them for a readout device or other ancillary coupling or transmission channel.

36. The method of claim 34, further comprising disposing a conductive lead in communication with each of said counter electrode, reference electrode, and working electrode.

37. The method of claim 36, wherein each of said conductive lead is configured to communicate with a readout device or other ancillary coupling or transmission channel.

* * * * *